United States Patent
Lin et al.

(10) Patent No.: US 10,784,270 B2
(45) Date of Patent: Sep. 22, 2020

(54) METHOD TO IMPROVE FILL-IN WINDOW FOR EMBEDDED MEMORY

(71) Applicant: Taiwan Semiconductor Manufacturing Co., Ltd., Hsin-Chu (TW)

(72) Inventors: Meng-Han Lin, Hsinchu (TW); Te-Hsin Chiu, Miaoli County (TW); Wei Cheng Wu, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/051,721

(22) Filed: Aug. 1, 2018

(65) Prior Publication Data

US 2019/0393234 A1 Dec. 26, 2019

Related U.S. Application Data

(60) Provisional application No. 62/689,885, filed on Jun. 26, 2018.

(51) Int. Cl.
*H01L 27/11536* (2017.01)
*H01L 29/788* (2006.01)
(Continued)

(52) U.S. Cl.
CPC .... *H01L 27/11536* (2013.01); *H01L 21/0276* (2013.01); *H01L 21/28035* (2013.01);
(Continued)

(58) Field of Classification Search
CPC .......... H01L 27/11521; H01L 29/7883; H01L 27/11526; H01L 29/42328; H01L 29/66825
See application file for complete search history.

(56) References Cited

U.S. PATENT DOCUMENTS 9,082,837 B2 * 7/2015 Perera .................... H01L 29/78
9,508,835 B2 * 11/2016 Chang ............... H01L 27/11573
(Continued)

FOREIGN PATENT DOCUMENTS

KR   100831158 A   5/2008
KR   20080043033 A   5/2008

OTHER PUBLICATIONS

Non-Final Office Action dated Jan. 16, 2020 for U.S. Appl. No. 16/051,721.

*Primary Examiner* — Dung A. Le
(74) *Attorney, Agent, or Firm* — Eschweiler & Potashnik, LLC

(57) ABSTRACT

Various embodiments of the present application are directed to an IC, and associated forming methods. In some embodiments, the IC comprises a memory region and a logic region integrated in a substrate. A plurality of memory cell structures is disposed on the memory region. A plurality of logic devices is disposed on the logic region. A sidewall spacer is disposed along a sidewall surface of the logic devices, but not disposed along a sidewall surface of the memory cell structures. Thus, the inter-layer dielectric (ILD) fill-in window between adjacent memory cell structures is enlarged, compared to the approaches where the sidewall spacer is concurrently formed in both memory region and the logic region. Thereby, voids formation would be reduced or eliminated, and device quality would be improved.

20 Claims, 14 Drawing Sheets

(51) Int. Cl.

| | |
|---|---|
| *H01L 29/423* | (2006.01) |
| *H01L 29/49* | (2006.01) |
| *H01L 29/08* | (2006.01) |
| *H01L 29/66* | (2006.01) |
| *H01L 21/3213* | (2006.01) |
| *H01L 21/28* | (2006.01) |
| *H01L 21/311* | (2006.01) |
| *H01L 21/768* | (2006.01) |
| *H01L 21/762* | (2006.01) |
| *H01L 21/3105* | (2006.01) |
| *H01L 21/321* | (2006.01) |
| *H01L 21/027* | (2006.01) |
| *H01L 27/11521* | (2017.01) |

(52) U.S. Cl.
CPC .. *H01L 21/31053* (2013.01); *H01L 21/31111* (2013.01); *H01L 21/3212* (2013.01); *H01L 21/32133* (2013.01); *H01L 21/32139* (2013.01); *H01L 21/76224* (2013.01); *H01L 21/76802* (2013.01); *H01L 27/11521* (2013.01); *H01L 29/0847* (2013.01); *H01L 29/40114* (2019.08); *H01L 29/42328* (2013.01); *H01L 29/4916* (2013.01); *H01L 29/6656* (2013.01); *H01L 29/66545* (2013.01); *H01L 29/66825* (2013.01); *H01L 29/788* (2013.01)

(56) References Cited

U.S. PATENT DOCUMENTS

| | | | |
|---|---|---|---|
| 9,583,499 B1* | 2/2017 | Zhu | H01L 27/11524 |
| 10,032,783 B2* | 7/2018 | Shum | H01L 21/823425 |
| 10,332,884 B2* | 6/2019 | Yi | H01L 27/0924 |
| 2004/0065917 A1* | 4/2004 | Fan | H01L 27/11521 |
| | | | 257/315 |
| 2014/0197472 A1 | 7/2014 | Chang et al. | |
| 2018/0012898 A1 | 1/2018 | Wu et al. | |
| 2018/0151579 A1 | 5/2018 | Liu et al. | |

\* cited by examiner

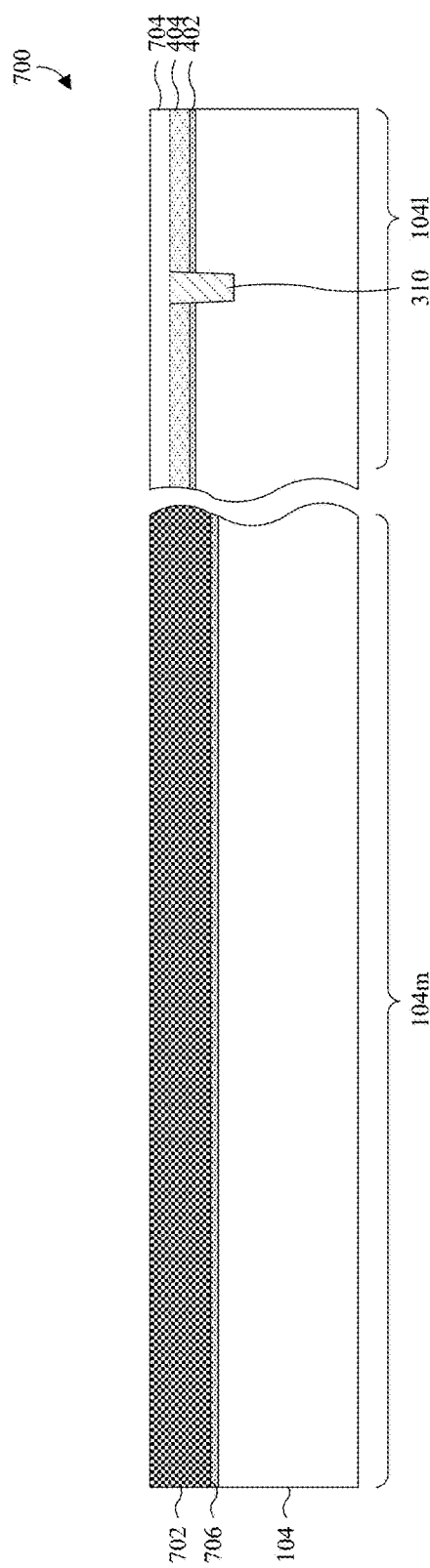
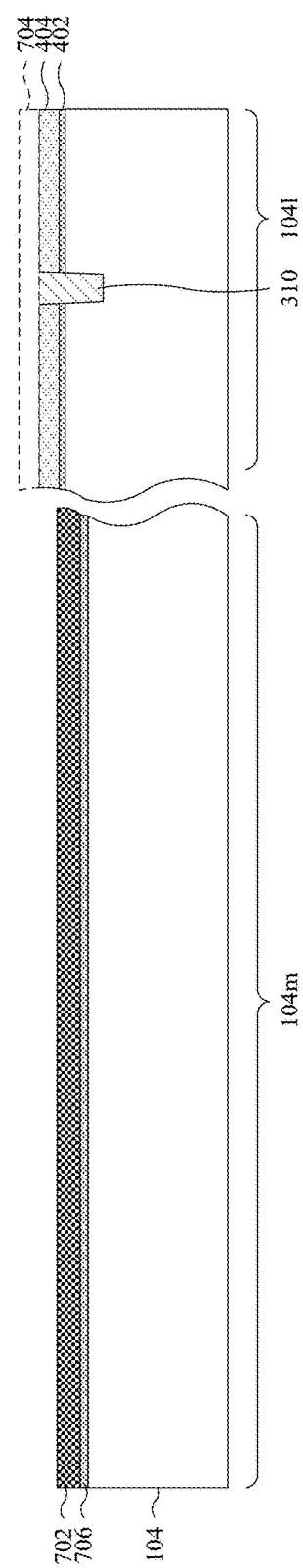
Fig. 7
Fig. 8

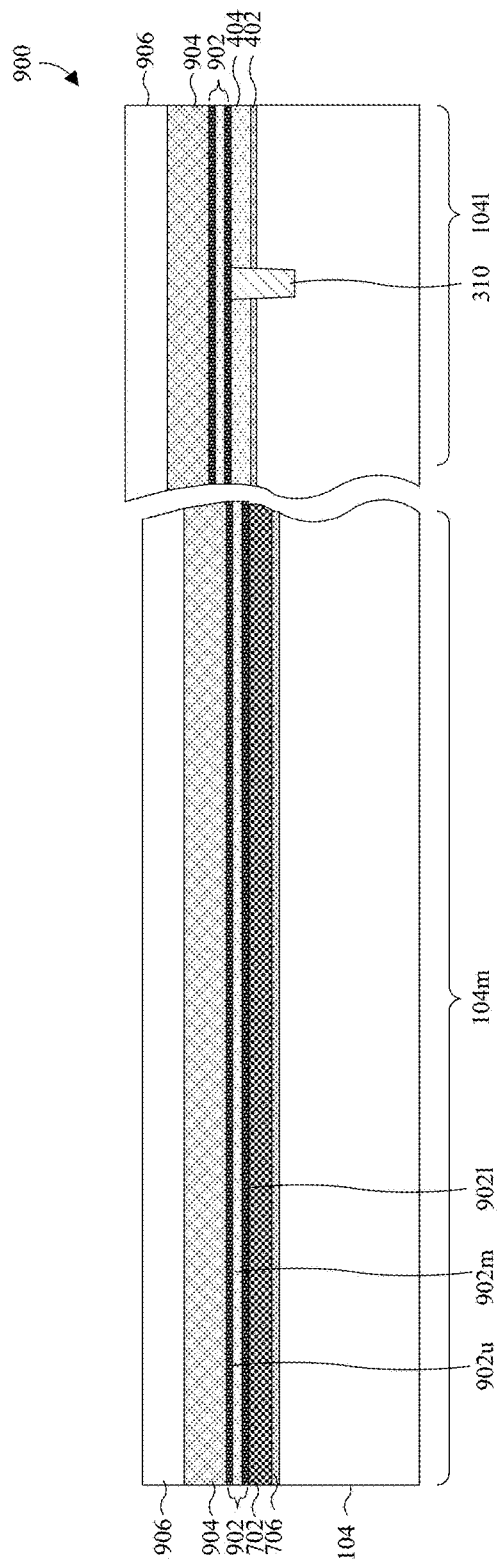
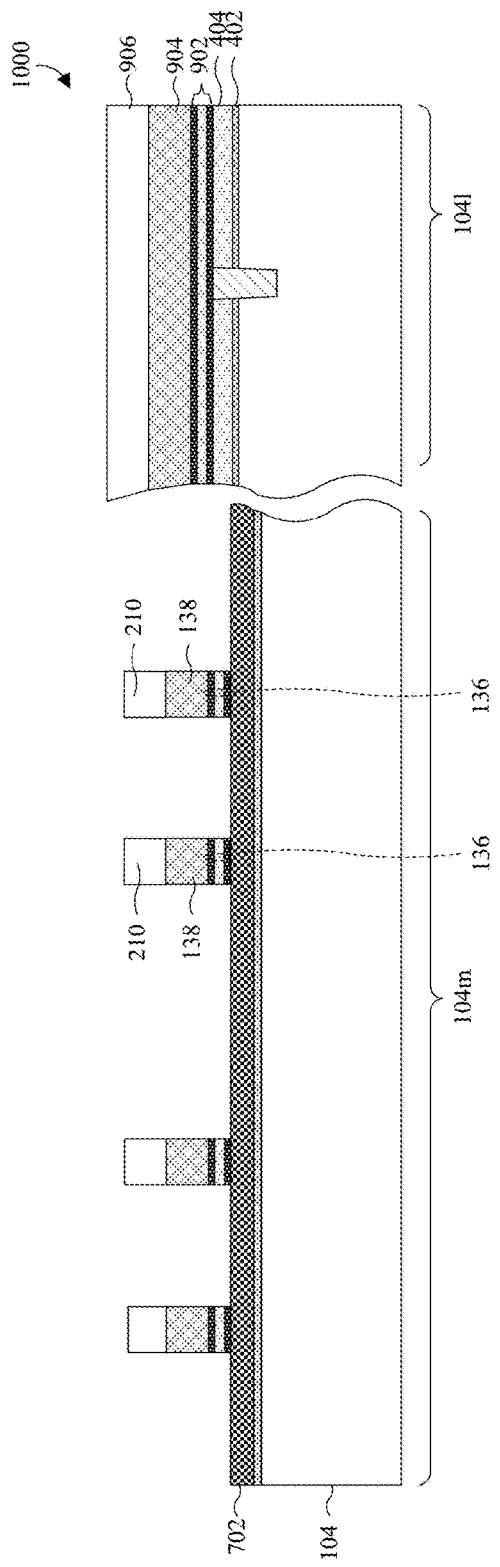
Fig. 9
Fig. 10

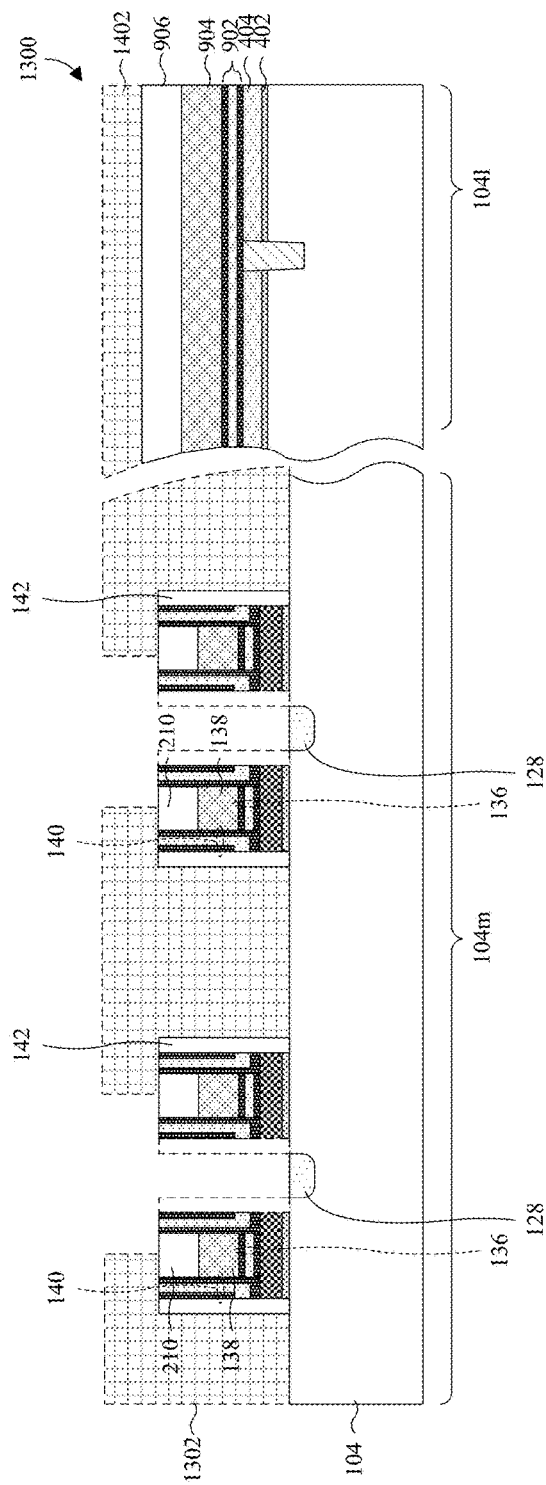
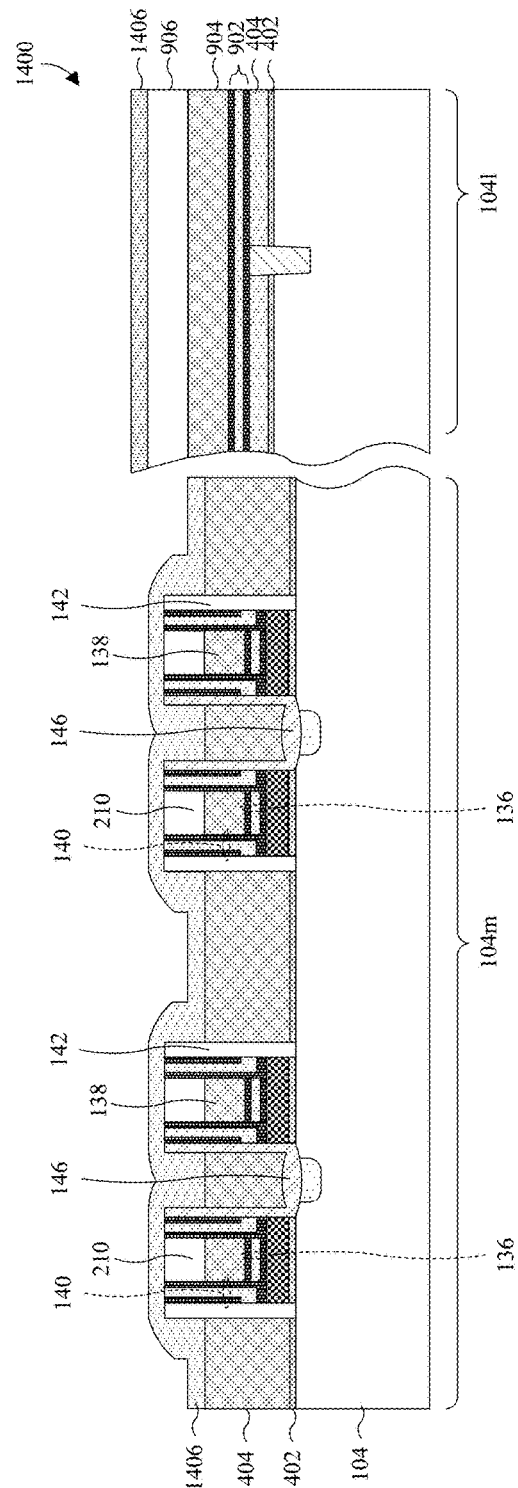

METHOD TO IMPROVE FILL-IN WINDOW FOR EMBEDDED MEMORY

REFERENCE TO RELATED APPLICATION

This Application claims priority to U.S. Provisional Application No. 62/689,885 filed on Jun. 26, 2018, the contents of which are hereby incorporated by reference in their entirety.

BACKGROUND

The integrated circuit (IC) manufacturing industry has experienced exponential growth over the last few decades. As ICs have evolved, functional density (i.e., the number of interconnected devices per chip area) has generally increased while geometry size (i.e., the smallest component (or line) that can be created) has decreased. Some advancements in the evolution of ICs include embedded memory technology and high κ metal gate (HKMG) technology. Embedded memory technology is the integration of memory devices with logic devices on the same semiconductor chip, such that the memory devices support operation of the logic devices. High κ metal gate (HKMG) technology is the manufacture of semiconductor devices using metal gate electrodes and high-κ gate dielectric layers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-26 illustrate a series of cross-sectional views of some embodiments of a method for forming an IC comprising an embedded memory boundary structure with a boundary sidewall spacer.

DETAILED DESCRIPTION

Figure 1:
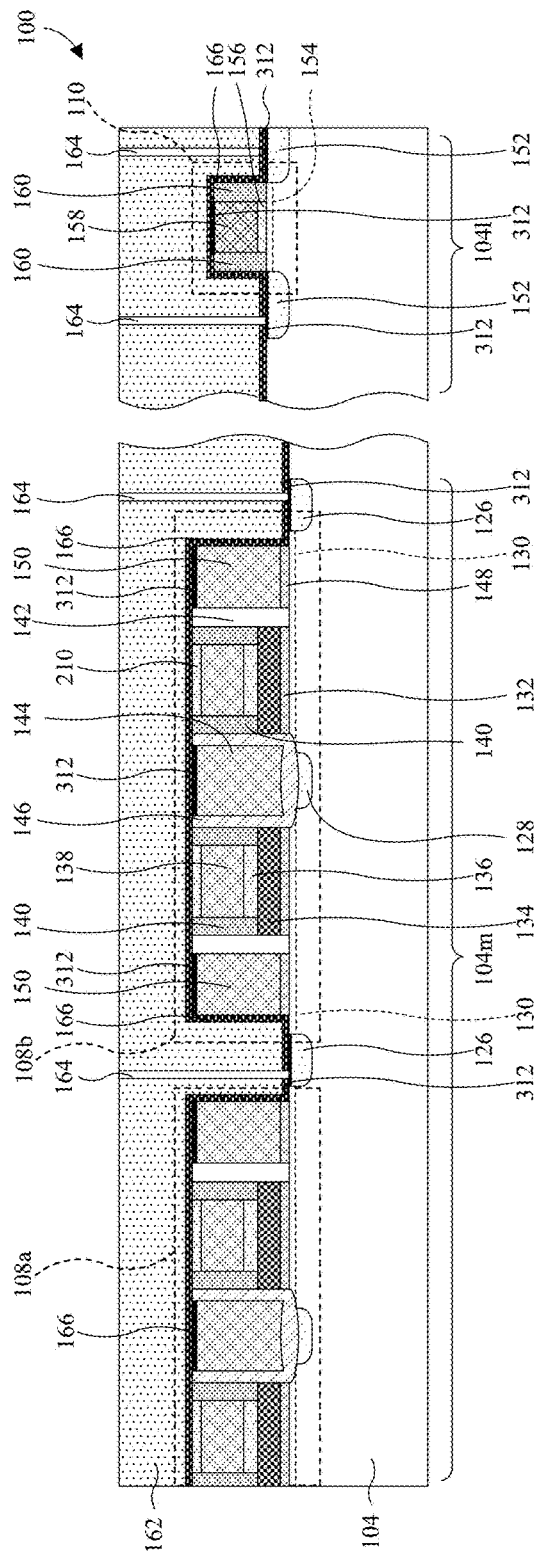
FIGS. 1 and 2 illustrate various cross-sectional views of some embodiments of an integrated circuit (IC) comprising an embedded memory boundary structure with a boundary sidewall spacer.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", and the like, may be used herein for ease of description to describe one element or feature's relationship to another element(s) or feature(s) as illustrated in the figures. The spatially relative terms are intended to encompass different orientations of the device or apparatus in use or operation in addition to the orientation depicted in the figures. The device or apparatus may be otherwise oriented (rotated 90 degrees or at other orientations) and the spatially relative descriptors used herein may likewise be interpreted accordingly. Even more, the terms "first", "second", "third", "fourth", and the like are merely generic identifiers and, as such, may be interchanged in various embodiments. For example, while an element (e.g., an opening) may be referred to as a "first" element in some embodiments, the element may be referred to as a "second" element in other embodiments.

According to some methods for manufacturing an integrated circuit (IC) with embedded memory technology, a memory device is firstly formed on a memory region of a substrate including forming a pair of floating gate electrodes insulated by dielectric material, forming a pair of control gate electrodes over the floating gate electrodes, and forming a pair of select gate on opposite sides of the pair of control gate electrodes. Then, the memory device is covered and protected by a dummy capping layer, and a logic gate electrode is formed on a logic region next to the memory region and separated from the substrate by a logic gate dielectric. Then, the dummy capping layer is removed to expose the formed memory device, and a sidewall spacer is formed on sidewall surfaces of both the select gate electrodes of the memory device and the logic gate electrode of the logic device. Source/drain regions are subsequently formed within the substrate alongside the select gate electrodes of the memory device and the logic gate electrode of the logic device.

A challenge with the methods described above is that the formation of the sidewall spacer on the sidewall surfaces of the select gate electrodes further narrows the lateral spaces between adjacent select gate electrodes. Since memory device has a higher gate height than that of the logic device, a narrow lateral space between adjacent select gate electrodes would result in a high aspect ratio for subsequent inter-layer dielectric (ILD) material filling-in for the memory device. As a result, voids could be formed between adjacent memory cells. The voids may lead to defects during subsequent manufacturing processes. For example, when forming plugs or contacts, the filled inter-layer dielectric material is etched to form a trench that is filled with conductive material. The voids within the inter-layer dielectric material may introduce unwanted shorting or bridging.

In view of the foregoing, various embodiments of the present application are directed to an integrated circuit (IC) comprising an embedded memory and a method for forming the IC. In some embodiments, the IC comprises a memory region and a logic region integrated in a substrate. A memory cell structure is disposed on the memory region. A logic device is disposed on the logic region. A sidewall spacer is disposed along a sidewall surface of the logic device, but not disposed along a sidewall surface of the memory cell structure. As a result, the later formed contact etch stop layer (CESL) may contact the sidewall spacer within the logic region and directly contact the memory cell structure within the memory region. Thus, the inter-layer dielectric (ILD) fill-in spaces between adjacent memory cell structures is enlarged, compared to the approaches where the sidewall spacer is concurrently formed in both memory region and the logic region. Thereby, voids formation would be reduced or eliminated, and device quality would be improved.

FIG. 1 shows a cross-sectional view an IC 100 according to some embodiments. The IC 100 has a substrate 104 including a memory region 104m and a logic region 104l. A plurality of memory cell structures 108a, 108b is disposed on the memory region 104m, and a logic device 110 is disposed on the logic region 104l. An inter-layer dielectric (ILD) layer 162 is filled between and overlying the plurality of memory cell structures 108a, 108b and the logic device 110. In some embodiments, a sidewall spacer 160 is disposed alongside the logic device 110, and is absent from the memory cell structure 108b. Thus, a space between adjacent memory cell structures (e.g. between the memory cell structures 108a and 108b) is broadened, compared to a memory device where the sidewall spacer 160 is formed alongside the memory cell structures 108a, 108b. The inter-layer dielectric (ILD) layer 162 is thereby better filled in the space, and voids are reduced or eliminated therein. It is noted that for simplicity, only components of the memory cell structure 108b is labeled in FIG. 1 and described hereafter, however, the memory cell structure 108a and other memory cell structures not shown or labeled in FIG. 1 could have same or different components than the memory cell structure 108b.

The substrate 104 may comprise, for example, a bulk silicon substrate, a group III-V substrate, a silicon-on-insulator (SOI) substrate, or some other suitable semiconductor substrate(s). In some embodiments, the memory cell structure 108b comprises a pair of individual memory source/drain regions 126, a common memory source/drain region 128, and a pair of selectively-conductive memory channels 130. The individual memory source/drain regions 126 and the common memory source/drain region 128 are in a top of the substrate 104, and the common memory source/drain region 128 is laterally spaced between the individual memory source/drain regions 126. Further, the individual memory source/drain regions 126 and the common memory source/drain region 128 are doped semiconductor regions having a first doping type (e.g., p-type or n-type). The selectively-conductive memory channels 130 are doped semiconductor regions having a second doping type (e.g., p-type or n-type) opposite the first doping type.

A pair of floating gate dielectric layers 132, a pair of floating gate electrodes 134, a pair of control gate dielectric layers 136, and a pair of control gate electrodes 138 are stacked on the selectively-conductive memory channels 130. For ease of illustration, only one of the floating gate dielectric layers 132 is labeled 132, only one of the floating gate electrodes 134 is labeled 134, only one of the control gate dielectric layers 136 is labeled 136, and only one of the control gate electrodes 138 is labeled 138. The floating gate dielectric layers 132 respectively overlie the selectively-conductive memory channels 130 and may be or otherwise comprise, for example, silicon oxide or some other suitable dielectric(s). The floating gate electrodes 134 respectively overlie the floating gate dielectric layers 132, the control gate dielectric layers 136 respectively overlie the floating gate electrodes 134, and the control gate electrodes 138 respectively overlie the control gate dielectric layers 136. In some embodiments, a pair of control gate hard masks 210 respectively overlies the control gate electrodes 138. The control gate hard masks 210 may each be or otherwise comprise, for example, silicon nitride, silicon oxide, some other suitable dielectric(s), or any combination of the foregoing. In some alternative embodiments, some or all of the control gate hard masks 210 may not present in the final device structure. The control gate electrodes 138 and the floating gate electrodes 134 may be or otherwise comprise, for example, doped polysilicon, metal, or some other suitable conductive material(s). The control gate dielectric layers 136 may be or otherwise comprise, for example, silicon nitride, silicon oxide, some other suitable dielectric(s), or any combination of the foregoing. In some embodiments, the control gate dielectric layers 136 each comprise ONO films, such that the control gate dielectric layers 136 each comprise a lower oxide layer, an upper oxide layer, and a middle nitride layer sandwiched between the lower an upper oxide layers.

A pair of control gate spacers 140 overlies each of the floating gate electrodes 134. The control gate spacers 140 of each floating gate electrode respectively line opposite sidewalls of each of the corresponding control gate electrodes 138. For ease of illustration, only some of the control gate spacers 140 are labeled 140. Floating gate spacers 142 respectively overlie the selectively-conductive memory channels 130, each laterally spaced from the common memory source/drain region 128 by a respective one of the floating gate electrodes 134. Further, the floating gate spacers 142 each line a sidewall of the respective one of the floating gate electrodes 134. The control gate spacers 140 and the floating gate spacers 142 may be or otherwise comprise, for example, silicon nitride, silicon oxide, some other suitable dielectric(s), or any combination of the foregoing. In some embodiments, the control gate spacers 140 are each ONO films, the constituents of which are not shown for ease of illustration.

An erase gate electrode 144 and an erase gate dielectric layer 146 overlie the common memory source/drain region 128, laterally between the floating gate electrodes 134. The erase gate electrode 144 overlies the erase gate dielectric layer 146 and, in some embodiments, has a top surface even with top surfaces respectively of the control gate electrodes 138. The erase gate dielectric layer 146 cups an underside of the erase gate electrode 144 to vertically space the erase gate electrode 144 from the common memory source/drain region 128, and to laterally space the erase gate electrode 144 from the floating gate electrodes 134 and the control gate spacers 140. The erase gate electrode 144 may be or otherwise comprise, for example, doped polysilicon, metal, or some other suitable conductive material(s). The erase gate dielectric layer 146 may be or otherwise comprise, for example, silicon oxide, silicon nitride, or some other suitable dielectric(s).

A pair of select gate dielectric layers 148 and a pair of select gate electrodes 150 are stacked on the selectively-conductive memory channels 130. For ease of illustration, only one of the select gate dielectric layers 148 is labeled 148. The select gate dielectric layers 148 respectively overlie the selectively-conductive memory channels 130, each laterally spaced from the common memory source/drain region 128 by a respective one of the floating gate electrodes 134. The select gate dielectric layers 148 may be or otherwise comprise, for example, silicon oxide, silicon nitride, or some other suitable dielectric(s). The select gate electrodes 150 may be or otherwise comprise, for example, doped polysilicon, metal, or some other suitable conductive material(s).

The memory cell structure 108b may be or otherwise comprise, for example, third generation embedded superflash (ESF3) memory, first generation embedded superflash (ESF1) memory, silicon-oxide-nitride-oxide-silicon (SO- NOS) memory, metal-oxide-nitride-oxide-silicon (MONOS) memory, or some other suitable type(s) of memory.

The logic device 110 may be or otherwise comprise, for example, an insulated field-effect transistor (IGFET), a metal-oxide-semiconductor field-effect transistor (MOSFET), a double-diffused metal-oxide-semiconductor (DMOS) device, a bipolar complementary metal-oxide-semiconductor (CMOS) DMOS (BCD) device, some other suitable transistor device(s), or some other suitable semiconductor device(s). In some embodiments, the logic device 110 comprises a pair of logic source/drain regions 152 and a selectively-conductive logic channel 154. Further, the logic source/drain regions 152 are doped semiconductor regions having a first doping type (e.g., p-type or n-type). Further, the selectively-conductive logic channel 154 is a doped semiconductor region having a second doping type (e.g., p-type or n-type) opposite the first doping type.

A logic gate dielectric layer 156 overlies the selectively-conductive logic channel 154, and a logic gate electrode 158 overlies the logic gate dielectric layer 156. The logic gate electrode 158 may be or otherwise comprise conductive material, for example, doped polysilicon or some other suitable conductive material(s). The logic gate dielectric layer 156 may be or otherwise comprise, for example, silicon nitride, silicon oxide, a high κ dielectric, some other suitable dielectric(s), or any combination of the foregoing. As used herein, a high κ dielectric is a dielectric with a dielectric constant κ greater than about 3.9.

In some embodiments, the sidewall spacer 160 line sidewall surfaces of the logic gate electrode 158 and the logic gate dielectric layer 156. The sidewall spacers 160 may be or otherwise comprise, for example, silicon nitride, silicon oxide, or some other suitable dielectric(s). Further, in some embodiments, a contact etch stop layer (CESL) 166 is disposed along a top surface of the substrate 104, extending upwardly along sidewall surfaces of the pair of select gate electrodes 150 within the memory region 104m, and extending upwardly along a sidewall surface of the sidewall spacer 160 within the logic region 104l. The contact etch stop layer (CESL) 166 is in direct contact with the sidewall surfaces of the pair of select gate electrodes 150 and separated from the sidewall surface of the logic gate electrode 158 by the sidewall spacer 160. An inter-layer dielectric (ILD) layer 162 is disposed on the contact etch stop layer (CESL) 166, covers the memory cell structures 108a, 108b, and the logic device 110. The inter-layer dielectric (ILD) layer 162 may be or otherwise comprise, for example, silicon oxide, silicon nitride, a low κ dielectric, some other suitable dielectric(s), or any combination of the foregoing. As used herein, a low κ dielectric is a dielectric with a dielectric constant κ less than about 3.9. Further yet, in some embodiments, contact vias 164 extend through the inter-layer dielectric (ILD) layer 162 to the logic source/drain regions 152 and the individual memory source/drain regions 126. The contact vias 164 are conductive and may be or otherwise comprise, for example, tungsten, aluminum copper, copper, aluminum, some other suitable metal(s), or some other suitable conductive material(s).

In some embodiments, silicide pads 312 respectively overlie the logic source/drain regions 152, the individual memory source/drain regions 126, the erase gate electrode 144, the select gate electrodes 150 and/or the logic gate electrode 158. For ease of illustration, only some of the silicide pads 312 are labeled 312. The silicide pads 312 may be or otherwise comprise, for example, be nickel silicide or some other suitable silicide(s).

Figure 2:
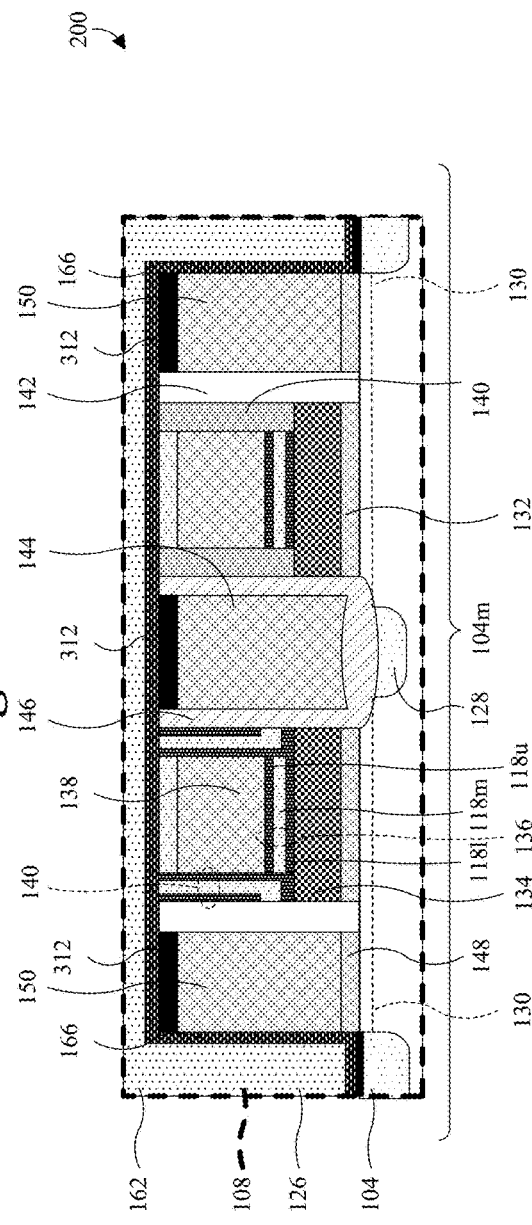

With reference to FIG. 2, an enlarged cross-sectional view 200 of some embodiments of the memory cell structure 108b in FIG. 1 is provided. In some embodiments, the control gate dielectric layer 136 comprises a lower oxide layer 118l, an upper oxide layer 118u overlying the lower oxide layer 118l, and a middle nitride layer 118m vertically sandwiched between the lower oxide layer 118l and the upper oxide layer 118u. The control gate spacers 140 may also comprise a middle nitride layer sandwiched between two oxide layers.

Figure 3:
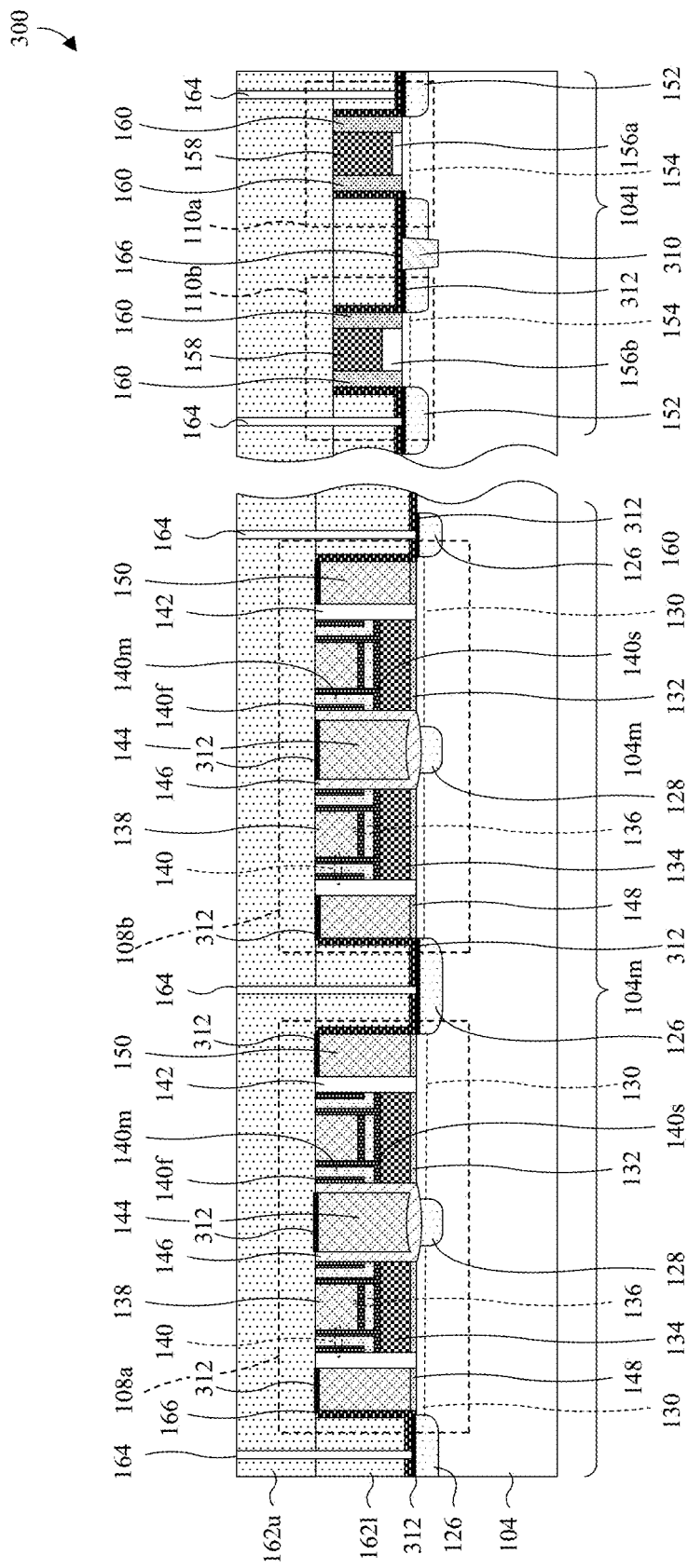
FIG. 3 illustrates a cross-sectional view of some additional embodiments of the IC of FIG. 1.

With reference to FIG. 3, a cross-sectional view 300 of some additional embodiments of the IC of FIGS. 1 and 2 are provided. As illustrated, in some embodiments, the logic gate dielectric layer 156 is a high κ dielectric and the logic gate electrode 158 is metal. The select gate electrodes 150, the erase gate electrode 144, the control gate electrodes 138, and the floating gate electrodes 134 are doped polysilicon.

A first logic device 110a and a second logic device 110b are on the logic region 104l of the substrate 104, physically and electrically separated by a logic isolation structure 310 laterally between the first and second logic devices 110a, 110b. The logic isolation structure 310 may be or otherwise comprise, for example, an STI structure, a DTI structure, or some other suitable isolation structure(s). The first and second logic devices 110a, 110b may each be, for example, an IGFET, a MOSFET, a DMOS device, a BCD device, some other suitable transistor device(s), or some other suitable semiconductor device(s). In some embodiments, the first logic device 110a is an IGFET and the first logic device 110a is a power MOFSET configured to operate at higher voltages (e.g., voltages an order of magnitude higher) than the second logic device 110b. The power MOSFET may be or otherwise comprise, for example, a double-diffused metal-oxide-semiconductor (DMOS) device or some other suitable power MOSFET(s).

The first and second logic devices 110a, 110b each comprise a pair of logic source/drain regions 152 and a selectively-conductive logic channel 154. For ease of illustration, only some of the logic source/drain regions 152 are labeled 152. The logic source/drain regions 152 of each pair are in a top of the substrate 104 and are laterally spaced. Further, the logic source/drain regions 152 of each pair are doped semiconductor regions having a first doping type (e.g., p-type or n-type). The selectively-conductive logic channels 154 is a doped semiconductor region having a second doping type (e.g., p-type or n-type) opposite the first doping type of the respective pair of logic source/drain regions 152.

The first logic device 110a and the second logic device 110b may have different gate dielectric compositions for different operation voltages. As an example for non-limiting example, a first logic gate dielectric layer 156a and a logic gate electrode 158 are stacked on the selectively-conductive logic channel 154 of the first logic device 110a, while a second logic gate dielectric layer 156b and a logic pate electrode 158 are stacked on the selectively-conductive logic channel 154 of the second logic device 110b. The logic gate electrodes 158 may be or otherwise comprise, for example, metal, or some other suitable conductive material(s). The first and second logic gate dielectric layer 156a, 156b may be or otherwise comprise, for example, silicon nitride, silicon oxide, a high κ dielectric, some other suitable dielectric(s), or any combination of the foregoing. In some embodiments, the first logic gate dielectric layers 156a are silicon oxide and high κ dielectric stack, the second logic gate dielectric layers 156b are thicker silicon oxide and high κ dielectric stack, and the logic gate electrodes 158 are metal. In some embodiments, the sidewall spacers 160 comprise a plurality of sidewall spacers respectively lining sidewalls of the logic gate electrodes 158.

A lower ILD layer 162l and an upper ILD layer 162u are stacked on the substrate 104 and accommodate the contact vias 164. For ease of illustration, only some of the contact vias 164 are labeled 164. The lower ILD layer 162l is to the sides of the memory cell structure 108a, 108b and to the sides of the first and second logic devices 110a, 110b. Further, the lower ILD layer 162l has a top surface that is even (e.g., planar or substantially planar) with a top surface of the memory cell structure 108a, 108b, a top surface of the cell boundary structure 102, a top surface of the logic boundary structure 304, a top surface of the first logic device 110a, and a top surface of the second logic device 110b. The upper ILD layer 162u covers the lower ILD layer 162l, the memory cell structure 108a, 108b, the cell boundary structure 102, the logic boundary structure 304, the first logic device 110a, and the second logic device 110b. The lower and upper ILD layers 162l, 162u may be or otherwise comprise, for example, silicon oxide, silicon nitride, a low κ dielectric, some other suitable dielectric(s), or any combination of the foregoing.

Further, in some embodiments, the control gate spacers 140 overlying the floating gate electrodes 134 are or otherwise comprise ONO films, and/or silicide pads 312 respectively overlie the erase gate electrode 144, the select gate electrodes 150, the logic source/drain regions 152, and the individual memory source/drain regions 126. For ease of illustration, only one of the control gate spacers 140 is labeled 140, and only some of the silicide pads 312 are labeled 312. The ONO films may, for example, each comprises a first oxide layer 140f, a second oxide layer 140s, and a middle nitride layer 140m laterally sandwiched between the first and second oxide layers 140f, 140s. The silicide pads 312 may be or otherwise comprise, for example, be nickel silicide or some other suitable silicide(s).

With reference to FIGS. 4-26, a series of cross-sectional views 400-2600 illustrates some embodiments of a method for forming an IC comprising an embedded memory with no sidewall spacer within the memory region.

Figure 4:
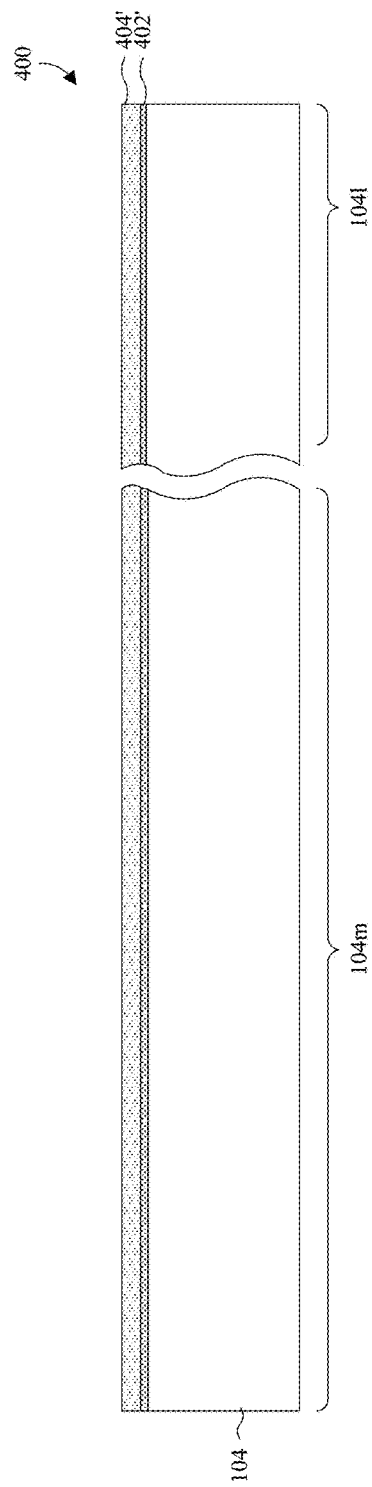

As illustrated by the cross-sectional view 400 of FIG. 4, a substrate 104 is prepared including a memory region 104m and a logic region 104l. In some embodiments, a sacrificial lower pad layer 402' is formed covering the substrate 104, and a sacrificial upper pad layer 404' is formed covering the sacrificial lower pad layer 402'. The sacrificial lower pad layer 402' and the sacrificial upper pad layer 404' are formed of different materials and may, for example, be formed by chemical vapor deposition (CVD), physical vapor deposition (PVD), sputtering, thermal oxidation, or some other suitable growth or deposition process(es). As used herein, a term (e.g., process) with a suffix of "(es)" may, for example, be singular or plural. The sacrificial lower pad layer 402' may, for example, be formed of silicon oxide or some other suitable dielectric(s), and/or the sacrificial upper pad layer 404' may, for example, be formed by silicon nitride or some other suitable dielectric(s).

Figure 5:
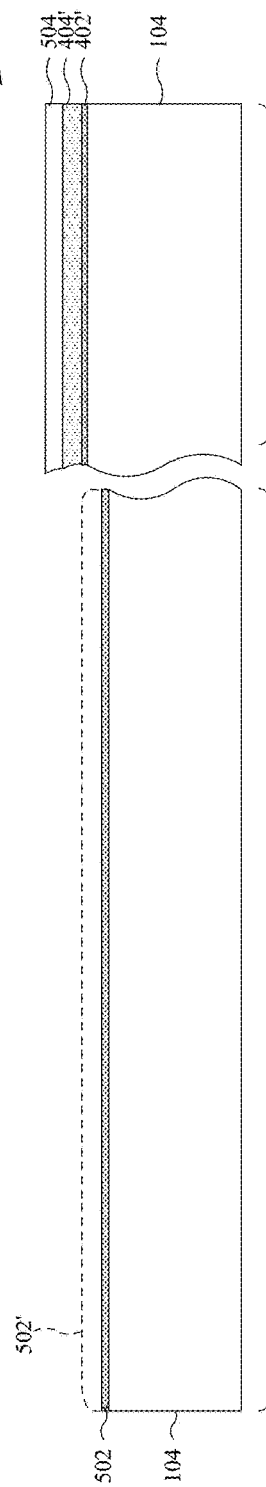

As illustrated by the cross-sectional view 500 of FIG. 5, the substrate 104 is recessed within the memory region 104m and a sacrificial dielectric layer 502 is formed within the memory region 104m. In some embodiments, the sacrificial upper pad layer 404' is patterned (according to a masking layer 504) to form an opening corresponding to the memory region 104m and to cover a logic region 104l. A precursor layer 502' is formed from a top surface of the substrate 104, and thus reduces a height of the top surface of the substrate 104 within the memory region 104m. In some embodiments, the precursor layer 502' is an oxide layer and formed by a wet process or a thermal process. The precursor layer 502' is subsequently partially removed and a lower remaining portion of the precursor layer 502' forms the sacrificial dielectric layer 502.

Figure 6:
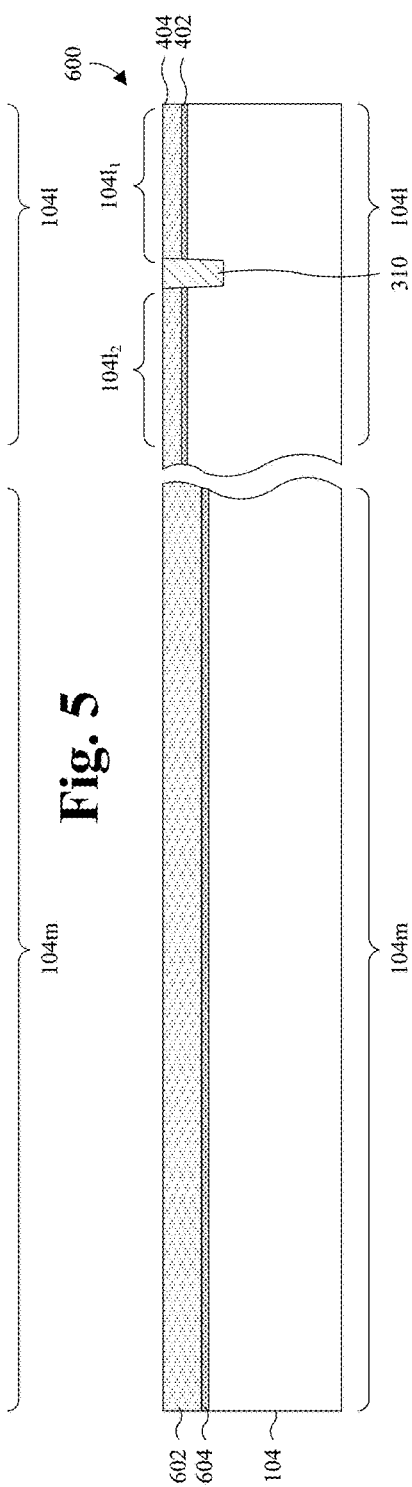

As illustrated by the cross-sectional view 600 of FIG. 6, the sacrificial dielectric layer 502 and the sacrificial lower pad layer 402' (see FIG. 5) may be removed and replaced with a memory dielectric layer 604 in the memory region 104m and a lower pad layer 402 in the logic region 104l. The sacrificial upper pad layer 404' is removed and replaced with a memory pad layer 602 formed on the memory dielectric layer 604 in the memory region 104m and an upper pad layer 404 formed on the lower pad layer 402 in the logic region 104l. The memory pad layer 602 and the upper pad layer 404 may be a dielectric material deposited as one conformal layer. Then the portion of the conformal dielectric material in the memory region 104m is etched and patterned to have a top surface aligned with that of the portion of the conformal dielectric material in the logic region 104l. Then, isolation structures are formed through the lower pad layer 402 and/or upper pad layer 404 including a logic isolation structure 310 within the logic region 104l. The isolation structure 310 divides the logic region 104l into a first logic region $104l_1$ and a second logic region $104l_2$. The first logic region $104l_1$ may, for example, support core logic devices formed hereafter, whereas the second logic region $104l_2$ may, for example, support high voltage logic devices formed hereafter. The high voltage logic devices may, for example, be logic devices configured to operate at higher voltages (e.g., an order of magnitude higher) than the core logic devices. The logic isolation structure 310 may, for example, comprise a dielectric material, and/or may be or otherwise comprise, for example, a STI structure, a DTI structure, or some other suitable isolation region(s).

In some embodiments, a process for forming the logic isolation structure 310 and/or other isolation structures, such as isolation structures within the memory region 104m, comprises patterning the lower and upper pad layers 402, 404 with layouts of the logic isolation structure 310 and/or other isolation structures, and an etch is performed into the substrate 104 with the lower and upper pad layers 402, 404 in place to form trenches with the layouts. A dielectric layer is formed filling the trenches, and a planarization is performed to the upper pad layer 404 to form the isolation structures in the trenches. The dielectric layer may, for example, be formed of silicon oxide or some other suitable dielectric material(s), and/or may, for example, be performed by CVD, PVD, sputtering, or some other suitable deposition process(es). The planarization may, for example, be performed by a chemical mechanical polish (CMP) or some other suitable planarization process(es). The patterning may, for example, be performed using photolithography and an etching process.

As illustrated by the cross-sectional views 700-1800 of FIGS. 7-18, a series of manufacturing processes is performed so as a memory cell structure is formed on the memory region 104m from a multilayer memory film, while leaving a remainder of the multilayer memory film on the logic region 104l. Some of the manufacturing processes are described below as an example and not for limiting purpose.

As illustrated by the cross-sectional view 700 of FIG. 7, the memory pad layer 602 and the memory dielectric layer 604 (referred to FIG. 6) are removed, and a memory dielectric layer 706 and a floating gate layer 702 are formed on the memory region 104m. In some embodiments, a capping layer 704 is formed and patterned to act as a masking layer for forming and patterning the floating gate layer 702. In some embodiments, the capping layer 704 may comprise one or more dielectric layers. For example, the capping layer 704 may comprise a silicon nitride layer and a silicon oxide layer formed on the silicon nitride layer. The capping layer 704 is formed and patterned to have an opening corresponding to the memory region 104m, and to cover the logic region 104l. The floating gate layer 702 is firstly formed over the memory dielectric layer 706 covering the memory region 104m and formed over the capping layer 704 covering the logic region 104l. The floating gate layer 702 may, for example, be formed conformally, and/or may, for example, be formed of doped polysilicon, metal, or some other suitable conductive material(s). In some embodiments, the floating gate layer 702 is formed by CVD, PVD, or some other suitable deposition process(es). Then, a planarization is performed into a top of the floating gate layer 702 until the capping layer 704 is reached, thereby removing the floating gate layer 702 from the capping layer 704. In some embodiments, the planarization recesses a topmost surface of the floating gate layer 702 to about even with a topmost surface of the capping layer 704. The planarization may, for example, be performed by a CMP or some other suitable planarization process(es).

As illustrated by the cross-sectional view 800 of FIG. 8, the floating gate layer 702 is further lowered for better couple ratio. The floating gate layer 702 may be lowered by a wet etching back process. After lowering the floating gate layer 702, the capping layer 704 may be subsequently removed. For example, at least the silicon oxide layer of the capping layer may be removed during or after lowering the floating gate layer 702.

As illustrated by the cross-sectional view 900 of FIG. 9, a multilayer memory film is formed covering the floating gate layer 702 and the upper pad layer 404. The multilayer memory film comprises a control gate dielectric layer 902, a control gate layer 904, and a control gate hard mask layer 906. In some embodiments, the control gate dielectric layer 902 comprises silicon oxide, silicon nitride, some other suitable dielectric(s), or any combination of the foregoing. For example, the control gate dielectric layer 902 may be an ONO film, and/or may comprise a lower oxide layer 902l, a middle nitride layer 902m covering the lower oxide layer 902l, and an upper oxide layer 902u covering the middle nitride layer 902m. The control gate dielectric layer 902 may, for example, be formed by CVD, PVD, some other suitable deposition process(es), or any combination of the foregoing. The control gate layer 904 is formed covering the control gate dielectric layer 902. The control gate layer 904 may, for example, be formed conformally, and/or may, for example, be formed of doped polysilicon, metal, or some other suitable conductive material(s). Further, in some embodiments, the control gate layer 904 is formed by CVD, PVD, or some other suitable deposition process(es). The control gate hard mask layer 906 is formed covering the control gate layer 904. In some embodiments, the control gate hard mask layer 906 comprises silicon oxide, silicon nitride, some other suitable dielectric(s), or any combination of the foregoing. For example, the control gate hard mask layer 906 may be a nitride-oxide-nitride (NON) film, and/or may comprise a lower nitride layer 906l, a middle oxide layer 906m covering the lower nitride layer 906l, and an upper nitride layer 906u covering the middle oxide layer 906m. The control gate hard mask layer 906 may, for example, be formed by CVD, PVD, some other suitable deposition process(es), or any combination of the foregoing.

As illustrated by the cross-sectional view 1000 of FIG. 10, an etch is performed into the multilayer memory film to remove portions of the multilayer memory film from the memory region 104m, thereby forming a pair of control gate electrodes 138 on the floating gate layer 702. Further, the etch forms a pair of control gate dielectric layers 136 and a pair of control gate hard masks 210. The control gate dielectric layers 136 respectively underlie the control gate electrodes 138, and the control gate hard masks 210 respectively overlie the control gate electrodes 138. In some embodiments, a process for performing the etch comprises forming and patterning a masking layer (e.g. a photoresist layer not shown in the figure) on the multilayer memory film so as to cover the logic region 104l, and so as to partially cover the memory region 104m with a layout of the control gate electrodes 138. An etchant is then applied to the multilayer memory film with the masking layer in place until the etchant reaches the floating gate layer 702, and the masking layer is thereafter removed.

Figure 11:
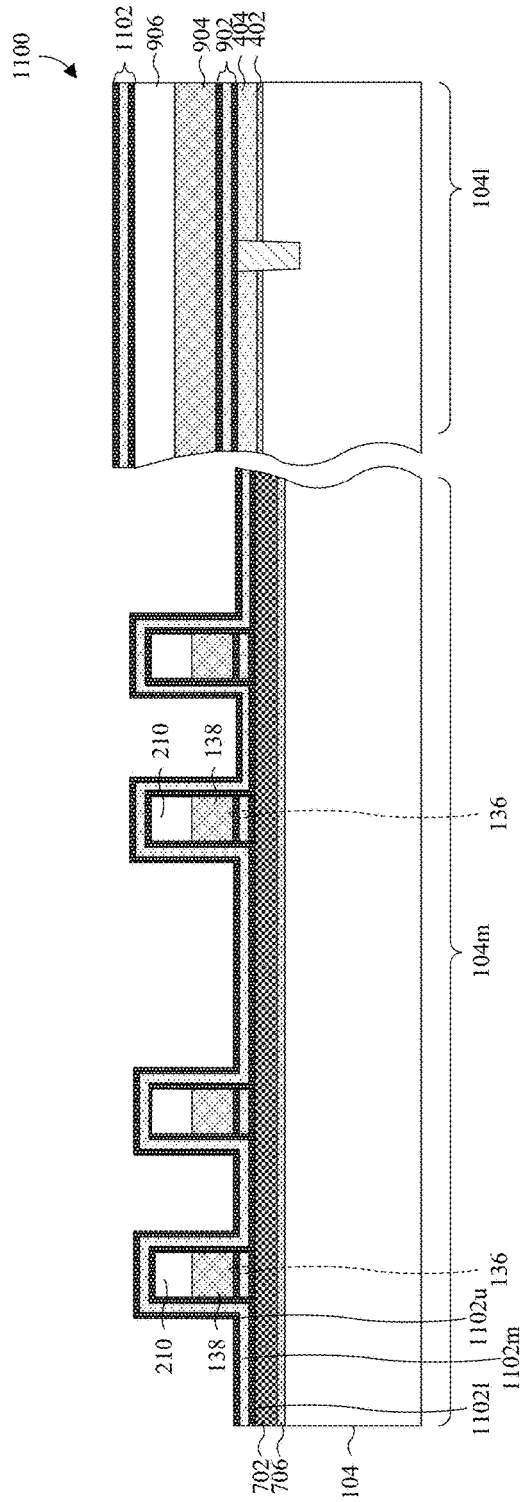

As illustrated by the cross-sectional view 1100 of FIG. 11, a control gate spacer layer 1102 is formed covering and lining the structure of FIG. 10. The control gate spacer layer 1102 may, for example, be formed conformally, and/or may, for example, be formed of silicon oxide, silicon nitride, some other suitable dielectric(s), or any combination of the foregoing. In some embodiments, the control gate spacer layer 1102 is or otherwise comprise an ONO film, and/or comprises a lower oxide layer 1102l, a middle nitride layer 1102m overlying the lower oxide layer 102l, and an upper oxide layer 1102u overlying the middle nitride layer 1102m. Further, the control gate spacer layer 1102 may, for example, be formed by CVD, PVD, or some other suitable deposition process(es).

Figure 12:
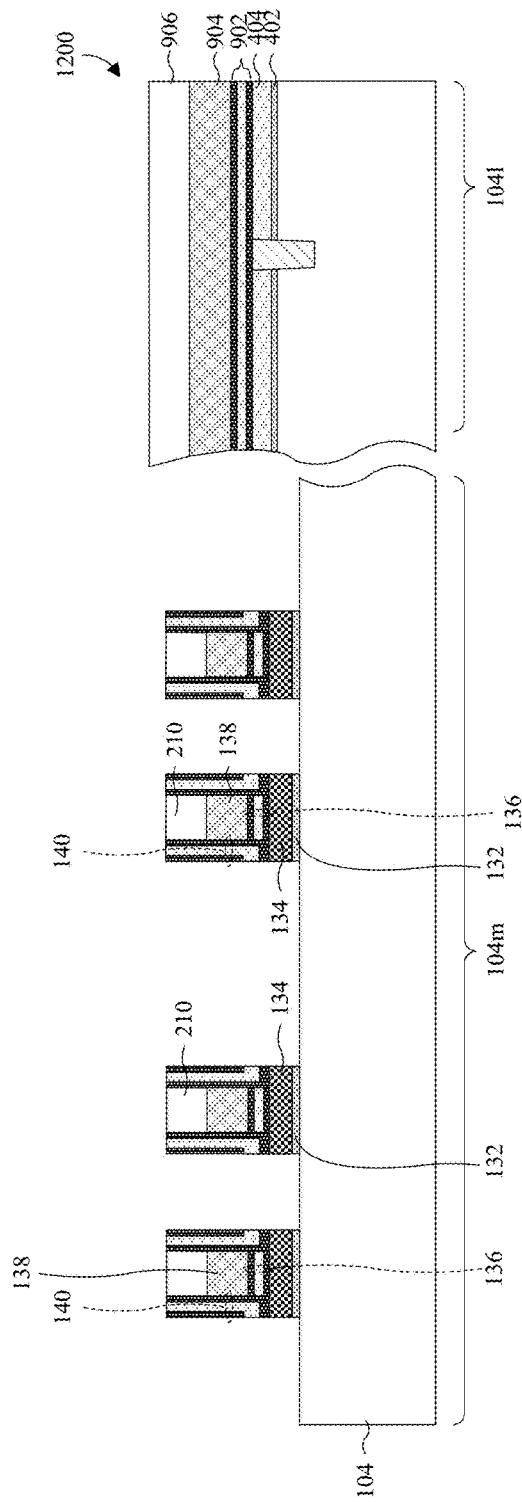

As illustrated by the cross-sectional view 1200 of FIG. 12, a first etch is performed into the control gate spacer layer 1102 (see FIG. 11) to form a control gate spacer 140 along sidewalls of the control gate electrodes 138. In some embodiments, a process for performing the etch comprises applying one or more etchants to the control gate spacer layer 1102 until horizontal segments of the control gate spacer layer 1102 are removed. Then, a second etch is performed into the floating gate layer 702 and the memory dielectric layer 706 (see FIG. 11), with the control gate spacers 140 in place, to form a pair of floating gate electrodes 134 and a pair of floating gate dielectric layers 132. The floating gate electrodes 134 respectively underlie the control gate electrodes 138 and are formed from the floating gate layer 702. The floating gate dielectric layers 132 respectively underlie the floating gate electrodes 134 and are formed from the memory dielectric layer 706. During the etch, the control gate spacers 140 and the control gate hard masks 210 serve as a mask.

As illustrated by the cross-sectional view 1300 of FIG. 13, a floating gate spacer 142 is formed on sidewalls of the floating gate electrodes 134 and the control gate spacers 140. In some embodiments, the floating gate spacer 142 comprises silicon oxide, some other suitable oxide(s), or some other suitable dielectric(s). Further, in some embodiments, a process for forming the floating gate spacer 142 comprises depositing a floating gate spacer layer followed by an etch to remove horizontal segments of the floating gate spacer layer without removing vertical segments of the floating gate spacer layer. The floating gate spacer layer may, for example, be deposited conformally, and/or may, for example, be formed by CVD, PVD, or some other suitable deposition process(es).

Then, common memory source/drain region 128 is formed in the substrate 104, laterally between the floating gate electrodes 134. In some embodiments, a process for forming the common memory source/drain region 128 comprises forming and patterning a masking layer 1302 covering the logic region 104*l* and the memory region 104*m* outside a common source/drain gap laterally between the floating gate electrodes 134. Ion implantation or some other suitable doping process(es) is performed with the masking layer 1302 in place, and the masking layer is thereafter removed.

As illustrated by the cross-sectional view 1400 of FIG. 14, an erase gate dielectric layer 146 is formed covering the common memory source/drain region 128, and further lining sidewalls of the floating gate electrodes 134 and sidewalls of the control gate spacers 140 within the common source/drain gap. The erase gate dielectric layer 146 may, for example, be formed of oxide, nitride, or some other suitable dielectric(s). In some embodiments, a process for forming the erase gate dielectric layer 146 comprises high temperature oxidation (HTO), in situ steam generation (ISSG) oxidation, some other suitable deposition or growth process(es), or any combination of the foregoing. Further, in some embodiments, the process comprises removing dielectric material that forms on portions of the memory region 104*m* outside the common source/drain gap.

Then, a memory dielectric layer 1402 is formed covering portions of the memory region 104*m* on opposite sides of the floating gate electrodes 134. The memory dielectric layer 1402 may, for example, be formed of oxide, nitride, or some other suitable dielectric(s). The memory dielectric layer 1402 may, for example, be formed by HTO, ISSG oxidation, some other suitable deposition or growth process(es), or any combination of the foregoing. A memory gate layer 1404 and a memory hard mask layer 1406 are formed on the memory dielectric layer 1402. The memory gate layer 1404 may, for example, be formed conformally, and/or may, for example, be formed of doped polysilicon, metal, or some other suitable conductive material(s). The memory gate layer 1404 may, for example, be formed by CVD, PVD, or some other suitable deposition process(es).

Figure 15:
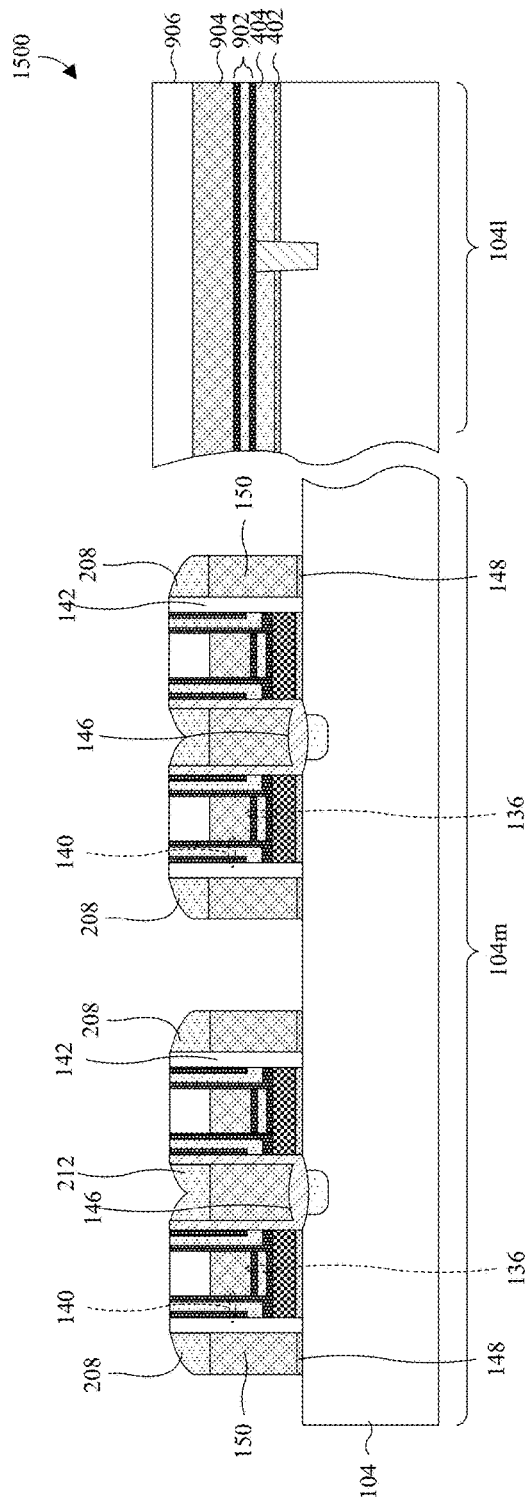

As illustrated by the cross-sectional view 1500 of FIG. 15, the memory hard mask layer 1406 (see FIG. 14) is patterned to form a pair of select gate hard masks 208 on opposite sides of the common memory source/drain region 128 and an erase gate hard mask 212 overlying the common memory source/drain region 128. Then, an etch is performed into the memory gate layer 1404 and the memory dielectric layer 1402 (see FIG. 14) with the select gate hard masks 208 and the erase gate hard mask 212 in place to form a pair of select gate electrodes 150, an erase gate electrode 144, and a pair of select gate dielectric layers 148.

Figure 16:
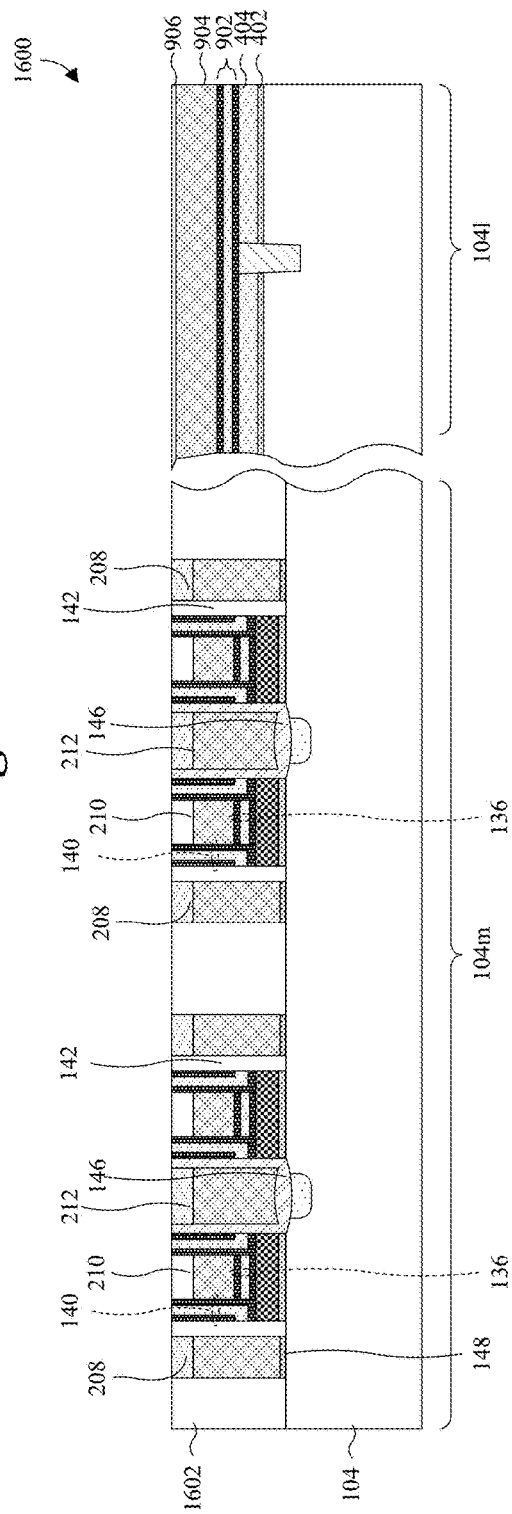

As illustrated by the cross-sectional view 1600 of FIG. 16, a first hard mask ARC 1602 is formed covering the structure described above followed by a planarization process. As such, a top surface of the first hard mask ARC 1602, top surfaces of the hard masks 210, 212, 208, and a top surface of the control gate hard mask layer 906 are etched back together once the first hard mask ARC 1602 is sufficiently etched to expose lower portions of the hard masks 210, 212, 208, and the control gate hard mask layer 906. The first hard mask ARC 1602 may be formed by a coating process or may be deposited by, for example, CVD, PVD, or some other suitable deposition process(es). The planarization may, for example, be performed by a CMP or some other suitable planarization process(es).

Figure 17:
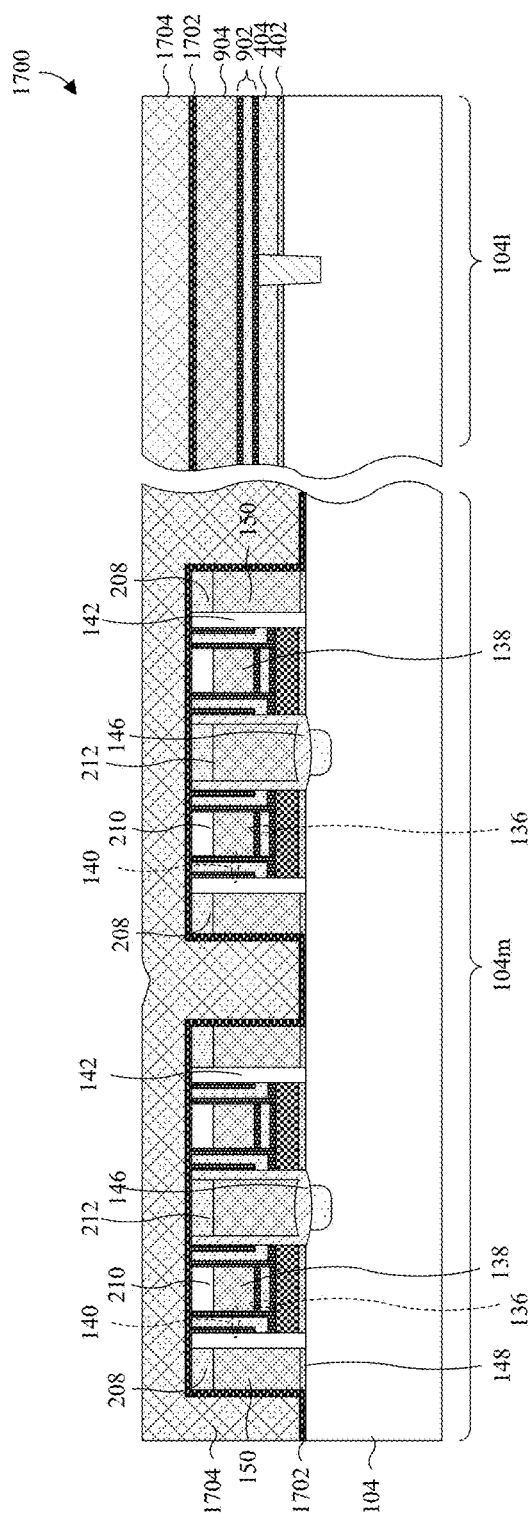

As illustrated by the cross-sectional view 1700 of FIG. 17, in some embodiments, the first hard mask ARC 1602 (see FIG. 16) is removed after the etch by, for example, another etching process or some other suitable removal process(es). A dummy liner layer 1702 is formed covering the structure of FIG. 16. The dummy liner layer 1702 may, for example, be formed conformally. In some embodiments, the dummy liner layer 1702 is formed of silicon oxide or some other suitable dielectric(s). A dummy capping layer 1704 is formed covering the dummy liner layer 1702. In some embodiments, the dummy capping layer 1704 is formed of polysilicon or some other suitable material(s). Further, the dummy liner layer 1702 and/or the dummy capping layer 1704 may, for example, be formed by CVD, PVD, some other suitable deposition process(es), or any combination of the foregoing, followed by a planarization process.

Figure 18:
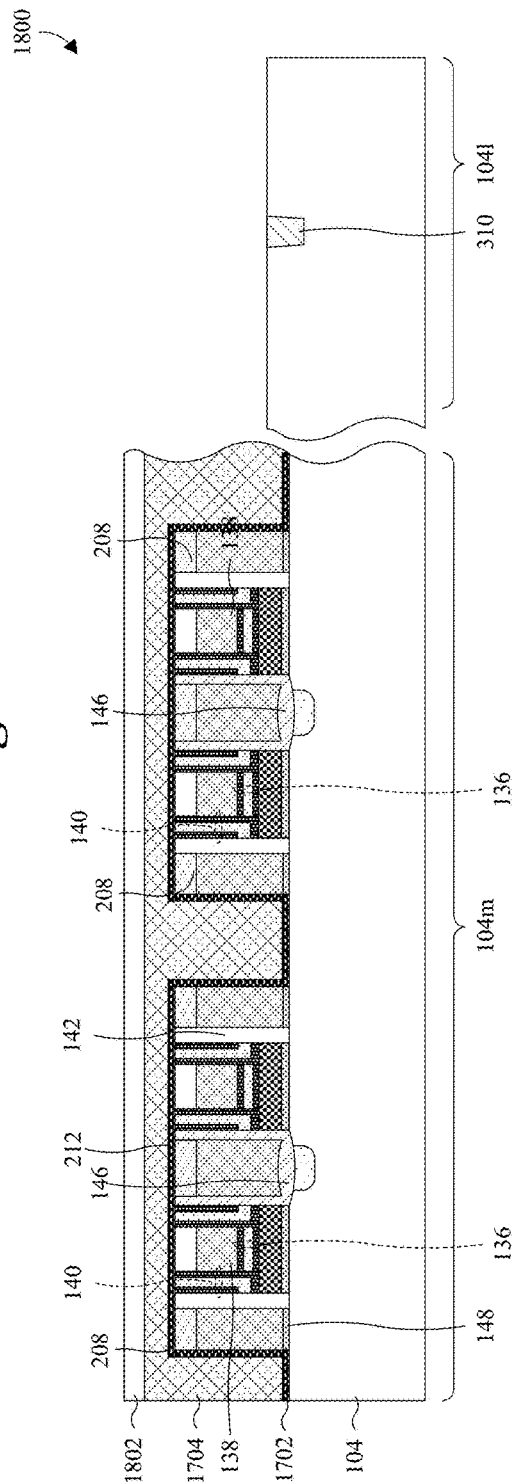

As illustrated by the cross-sectional view 1800 of FIG. 18, within the logic region 104*l*, an etch is performed into the dummy capping layer 1704, the dummy liner layer 1702, the control gate layer 904, the control gate dielectric layer 902, the upper pad layer 404, and the lower pad layer 402 (see FIG. 17). In some embodiments, the etch is performed by forming and patterning a photoresist layer 1802 covering the memory region 104*m*. An etchant is then applied with the photoresist layer 1802 in place until the etchant reaches an upper surface of the substrate 104, and the photoresist layer 1802 is thereafter stripped.

Figure 19:
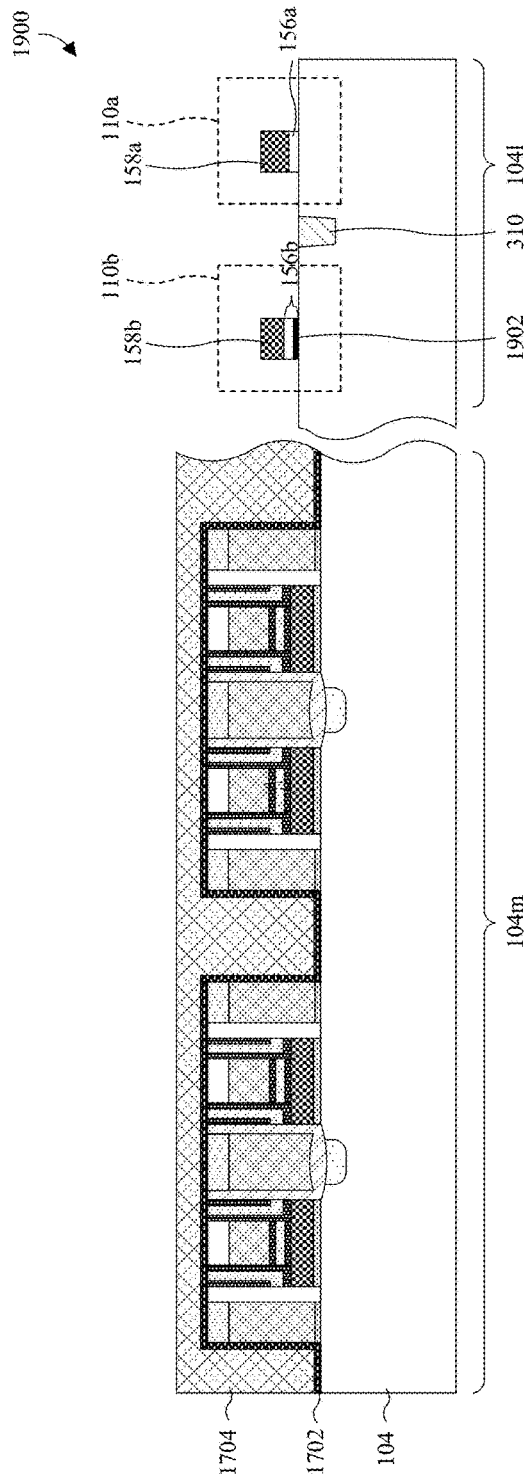

As illustrated by the cross-sectional view 1900 of FIG. 19, a logic device is formed within the logic region 104*l*. In some embodiments, a variety of the logic devices are formed within the logic region 104*l* with varies gate dielectric and gate electrode compositions. As an example, a first logic device 110*a* is formed in the first logic region 104$l_1$, and a second logic device 110*b* is formed in the second logic region 104$l_2$. The first logic device 110*a* and the second logic device 110*b* may be formed by forming a first logic gate dielectric layer 156*a* and a second logic gate dielectric layer 156*b* respectively in the first logic region 104$l_1$ and the second logic region 104$l_2$. The second logic gate dielectric layer 156*b* can be formed by depositing and patterning a HV dielectric layer 1902 in the second logic region 104$l_2$ and absent from the first logic region 104$l_1$. A logic dielectric layer is then formed and patterned on the HV dielectric layer 1902 in the second logic region 104$l_2$ to form the first second logic gate dielectric layer 156*b* collectively with the HV dielectric layer 1902 and to form the first logic gate dielectric layer 156*a* directly on the substrate 104 in the first logic region 104$l_1$. Though not shown in the figure, the logic dielectric layer may comprise one or multiple oxide or other dielectric layers and may be formed and patterned with varies compositions and thicknesses in different logic regions of the substrate 104. Further, a logic gate layer is formed and patterned on the first logic gate dielectric layer 156*a* to form a first logic gate electrode 158*a* in the first logic region 104$l_1$, and on the second logic gate dielectric layer 156*b* to form a second logic gate electrode 158*b* in the second logic region 104$l_2$. The HV dielectric layer 1902 may, for example, be formed of oxide, a high κ dielectric, some other suitable dielectric(s), or any combination of the foregoing. The HV dielectric layer 1902 may be formed conformally, and/or are formed by CVD, PVD, some other suitable growth or deposition process(es), or any combination of the foregoing. The logic dielectric layer may, for example, be formed of oxide, a high κ dielectric, some other suitable dielectric(s), or any combination of the foregoing. The logic gate layer may, for example, be formed of doped or undoped polysilicon, metal, some conductive material, or some other suitable material(s). In some embodiments, the logic dielectric layer and the logic gate layer are formed conformally, and/or are formed by CVD, PVD, electroless plating, electroplating, some other suitable growth or deposition process(es), or any combination of the foregoing.

Figure 20:
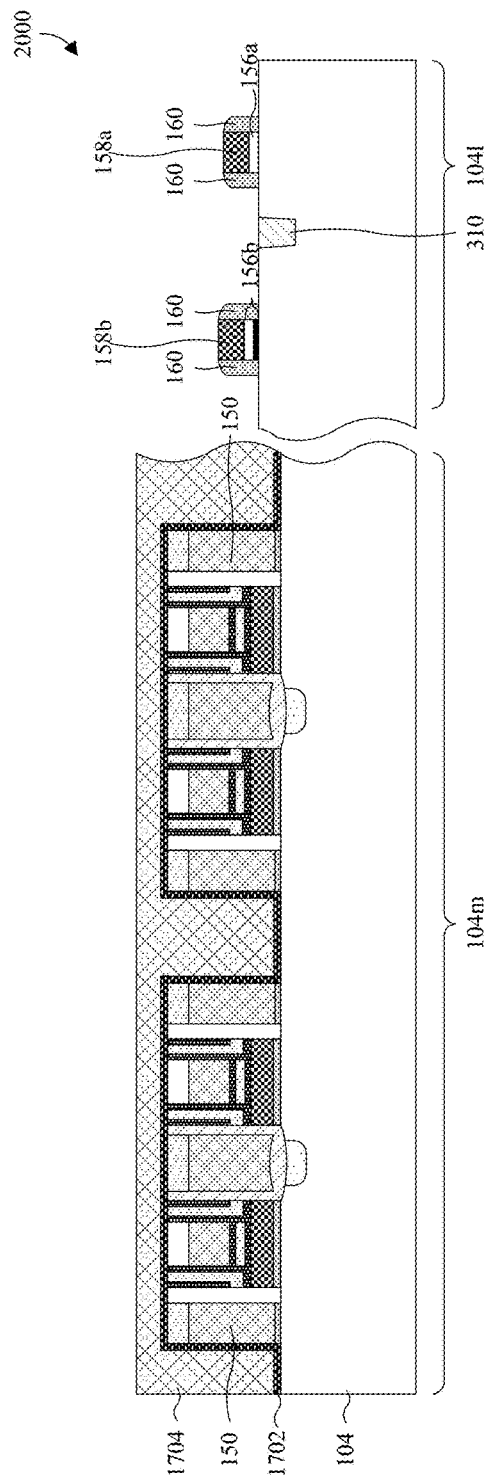

As illustrated by the cross-sectional view 2000 of FIG. 20, still with the dummy capping layer 1704 in place, a sidewall spacer 160 is formed along sidewalls of the logic gate electrodes 158a, 158b. The select gate electrodes 150 are covered by the dummy liner layer 1702 and the dummy capping layer 1704, such that the sidewall spacer 160 is not formed alongside the select gate electrodes 150. Compared to an alternative approach where the dummy capping layer 1704 and the dummy liner layer 1702 are removed from sides of the select gate electrodes 150, and the sidewall spacer 160 is formed alongside the select gate electrodes 150, a lateral space between adjacent select gate electrodes 150 is widened. Thus, the fill-in window for an inter-layer dielectric, which will be filled in the lateral space later (for example, as illustrated by the cross-sectional view 2300 of FIG. 23), is increased. Voids would be decreased, and the fill-in quality for the inter-layer dielectric would be improved.

In some embodiments, the sidewall spacer 160 comprises silicon oxide, silicon nitride, some other suitable dielectric(s), or any combination of the foregoing. Further, in some embodiments, a process for forming the sidewall spacer 160 comprises depositing a spacer layer covering and lining the structure of FIG. 20. An etch back is then performed into the spacer layer to remove horizontal segments of the spacer layer without removing vertical segments of the spacer layer. The spacer layer may, for example, be deposited conformally, and/or may, for example, be formed by CVD, PVD, some other suitable deposition process(es), or any combination of the foregoing.

Figure 21:
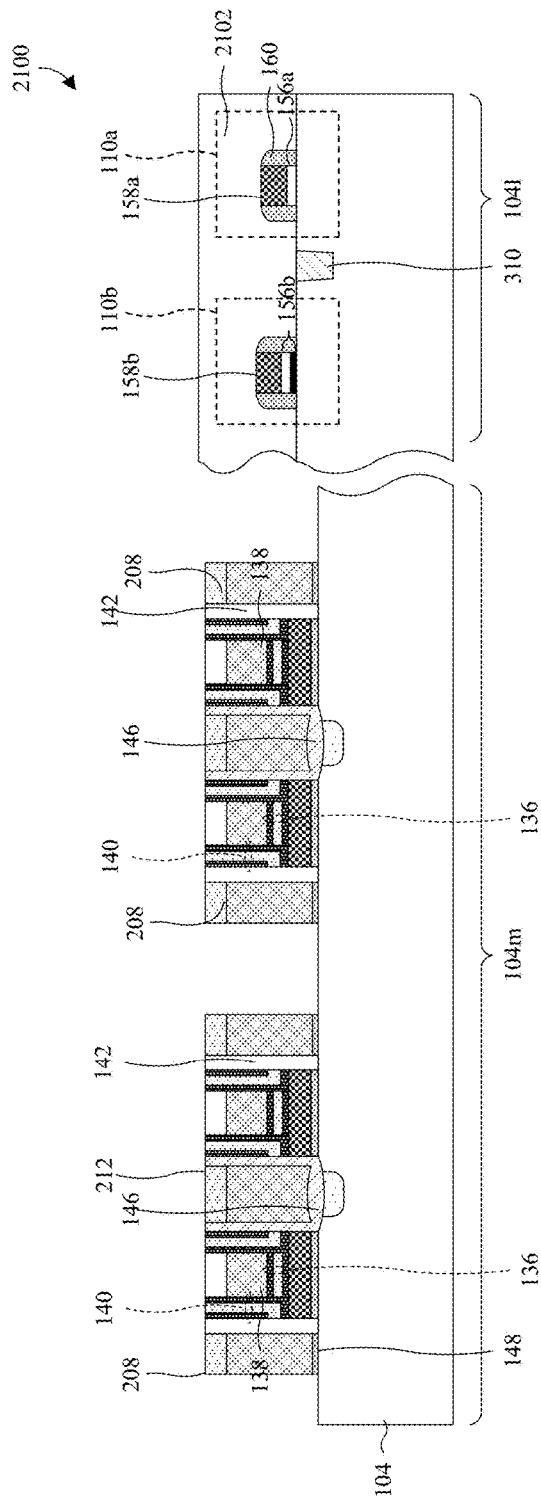

As illustrated by the cross-sectional view 2100 of FIG. 21, an etch is performed to the dummy capping layer 1704 and the dummy liner layer 1702 to be removed from the memory region 104m. In some embodiments, a masking layer 2102 is used to cover and protect the logic devices 110a, 110b from etching. The etch may comprise a series of dry and/or wet etching processes. The masking layer 2102 may be formed by photoresist.

Figure 22:
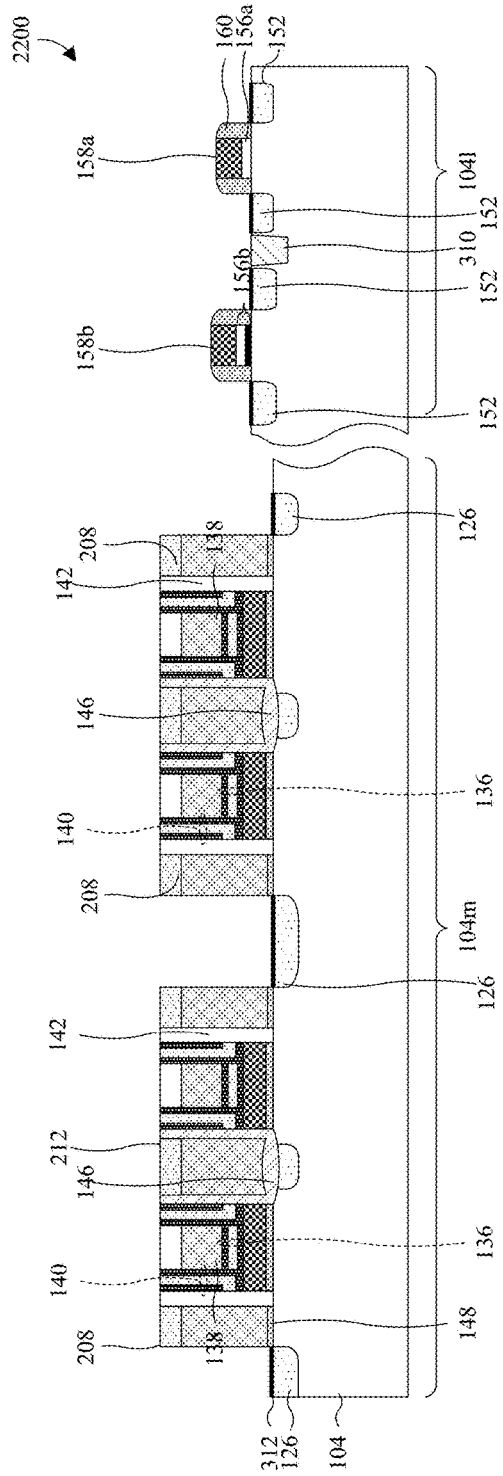

As illustrated by the cross-sectional view 2200 of FIG. 22, individual memory source/drain regions 126 are formed within the memory region 104m, respectively bordering the select gate electrodes 150. Also, logic source/drain regions 152 are formed in pairs within the logic region 104l, with the source/drain regions of each pair respectively bordering opposite sidewalls of the logic gate electrodes 158a, 158b. In some embodiments, a process for forming the individual memory source/drain regions 126 and the logic source/drain regions 152 comprises ion implantation into the substrate 104. In other embodiments, some process other than ion implantation is used to form the individual memory source/drain regions 126 and the logic source/drain regions 152.

Also illustrated by the cross-sectional view 2200 of FIG. 22, silicide pads 312 are formed on the individual memory source/drain regions 126 and the logic source/drain regions 152. For ease of illustration, only some of the silicide pads 312 are labeled 312. The silicide pads 312 may be or otherwise comprise, for example, be nickel silicide or some other suitable silicide(s), and/or may, for example, be formed by a salicide process, or some other suitable growth process(es).

Figure 23:
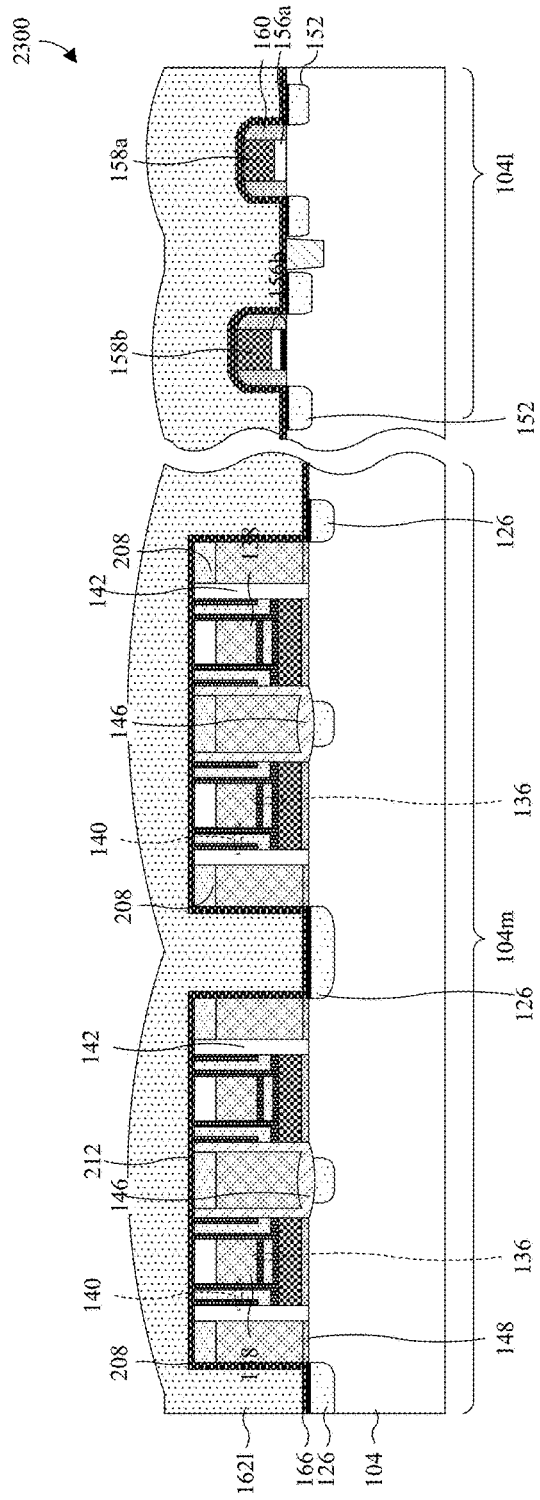

As illustrated by the cross-sectional view 2300 of FIG. 23, a contact stop etch layer (CSEL) 166 and a lower inter-layer dielectric (ILD) layer 162l are formed covering the structure of FIG. 22. The lower ILD layer 162l may, for example, be oxide, a low κ dielectric, some other suitable dielectric(s), or any combination of the foregoing. The lower ILD layer 162l may, for example, be deposited by CVD, PVD, sputtering, or any combination of the foregoing followed by a planarization process.

Figure 24:
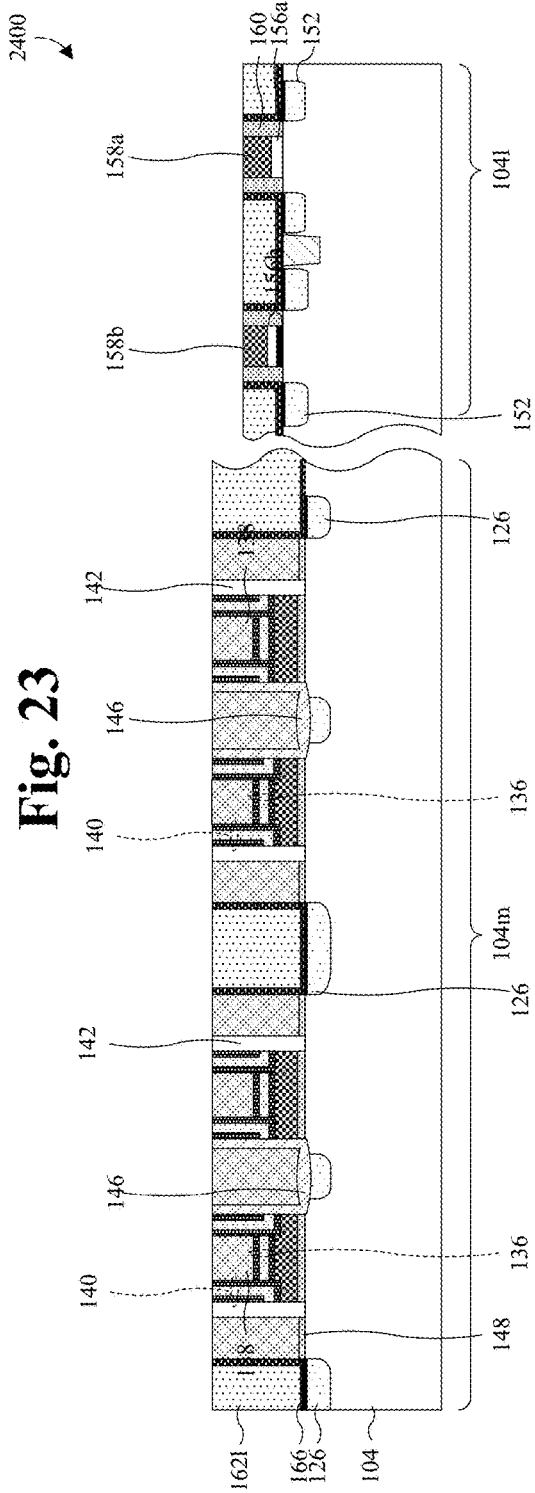

As illustrated by the cross-sectional view 2400 of FIG. 24, a planarization process is performed to the lower inter-layer dielectric (ILD) layer 162l and the contact stop etch layer (CSEL) 166. The planarization process may also remove the control, select, and erase gate hard masks 210, 208, 212 and expose the corresponding gate electrodes. The planarization process may, for example, a CMP or some other suitable planarization process(es). The lower ILD layer 162l is formed with a top surface that is coplanar or substantially coplanar with top surfaces of the remaining structure. The planarization process may, for example, a CMP or some other suitable planarization process(es). The planarization process may also recess a top surface of the lower ILD layer 162l to about even with top surfaces of the logic gate electrodes 158a, 158b, thereby exposing the logic gate electrodes 158a, 158b, the erase gate electrode 144 and the select gate electrodes 150. Though not shown in FIG. 24, in some embodiments, silicide pads may also be formed on the erase gate electrode 144 and the select gate electrodes 150 similar as shown in FIG. 3 after the planarization process.

Figure 25:
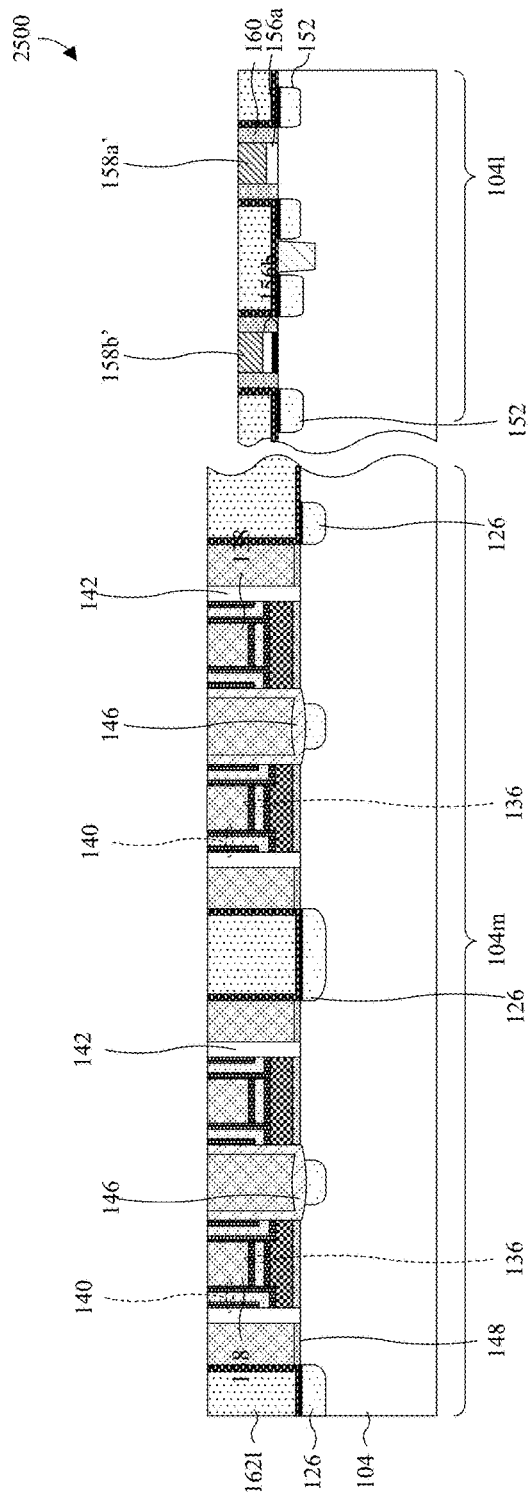

As illustrated by the cross-sectional view 2500 of FIG. 25, a replacement gate process is then performed: an etch is performed into the logic gate electrodes 158a, 158b to remove the logic gate electrodes 158a, 158b. In some embodiments, the etch is performed with a masking layer in place to protect other regions of the structure until the logic gate electrodes 158a, 158b are removed. Metal gate electrodes 158a', 158b' are then formed in place of the logic gate electrodes 158a, 158b. The metal gate electrodes 158a', 158b' may, for example, be metal, a different material than the logic gate electrodes 158a, 158b, or some other suitable conductive material(s). In some embodiments, a process for forming the metal gate electrodes 158a', 158b' comprises forming a conductive layer by, for example, by CVD, PVD, electroless plating, electroplating, or some other suitable growth or deposition process(es). A planarization is then performed into the conductive layer until the lower ILD layer 162l is reached. The planarization may, for example, be performed by a CMP or some other suitable planarization process(es).

Figure 26:
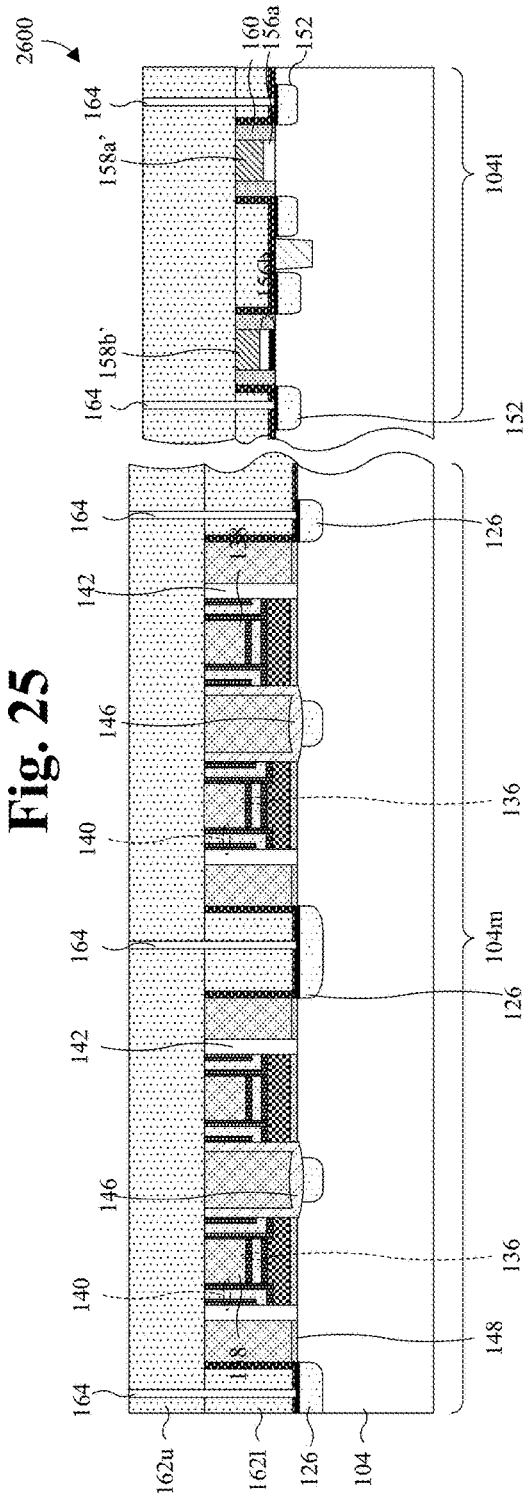

As illustrated by the cross-sectional view 2600 of FIG. 26, an upper ILD layer 162u is formed covering the structure of FIG. 25 and with a top surface that is planar or substantially planar. The upper ILD layer 162u may, for example, be oxide, a low κ dielectric, some other suitable dielectric(s), or any combination of the foregoing. Further, the upper ILD layer 162u may, for example, be formed depositing the upper ILD layer 162u, and subsequently performing a planarization into the top surface of the upper ILD layer 162u. The deposition may, for example, be performed by CVD, PVD, sputtering, or any combination of the foregoing. The planarization may, for example, be performed by a CMP or some other suitable planarization process(es).

Also illustrated by the cross-sectional view 2600 of FIG. 26, contact vias 164 are formed extending through the upper ILD layer 162u and the lower ILD layer 162l to the individual memory source/drain regions 126, the logic source/drain regions 152, the common memory source/drain region 128, the control gate electrodes 138, the select gate electrodes 150, the erase gate electrode 144, the logic gate electrodes 158a, 158b, or any combination of the foregoing.

Figure 27:
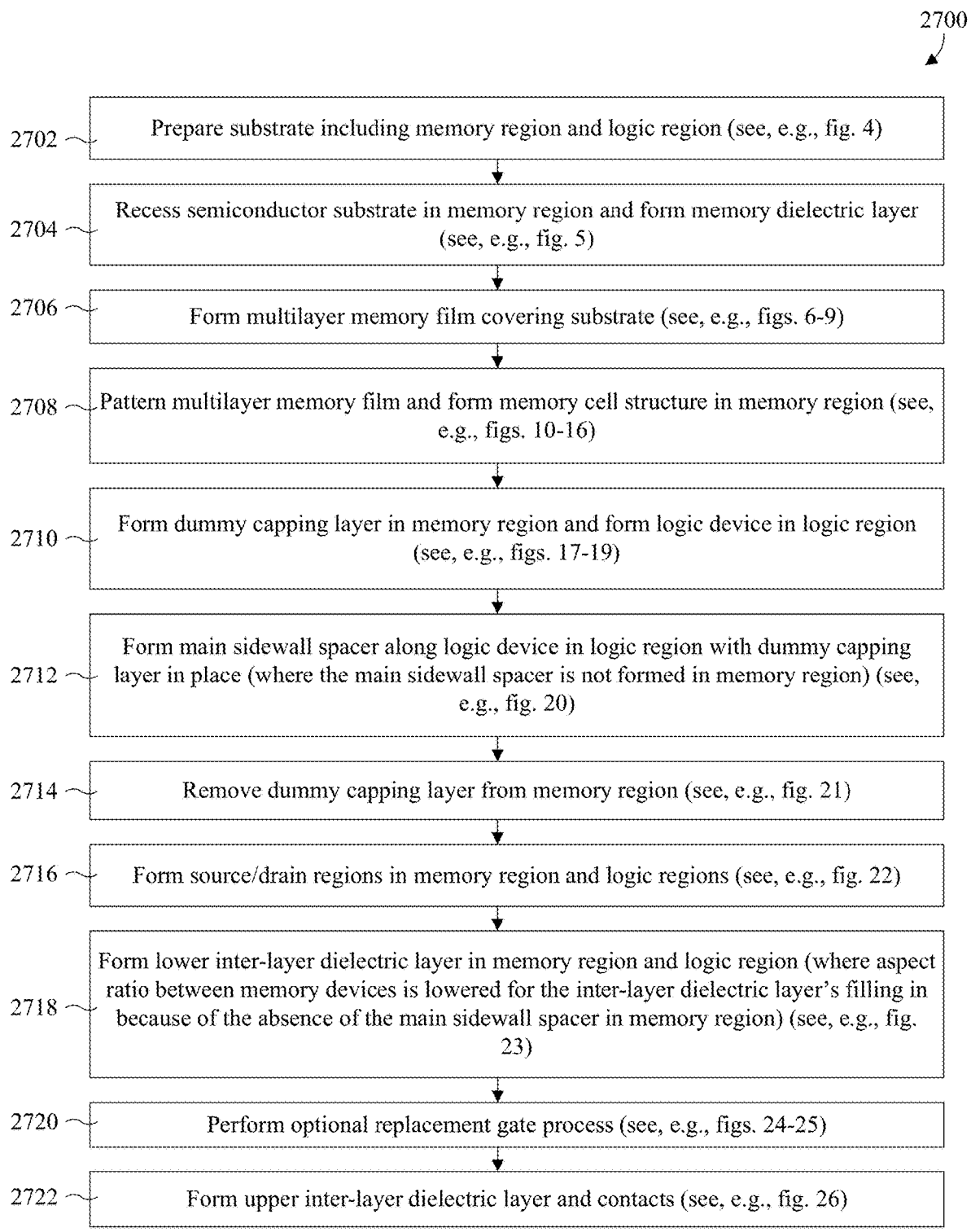
FIG. 27 illustrates a flowchart of some embodiments of the method of FIGS. 4-26.

With reference to FIG. 27, a flowchart 2700 of some embodiments of a method for forming an IC comprising an embedded memory boundary structure without a boundary sidewall spacer is provided. The IC may, for example, correspond to the IC of FIGS. 4-26.

At step 2702, a substrate is provided. The substrate comprises a memory region and a logic region. A memory dielectric layer is formed in memory region. See, for example, FIG. 4.

At step 2704, the substrate is recessed within the memory region. A memory dielectric layer is formed within the memory region. See, for example, FIG. 5.

At step 2706, a multilayer memory film is formed within the memory region covering the substrate. See, for example, FIGS. 6-9.

At step 2708, memory cell structures are formed within the memory region from the multilayer memory film. See, for example, FIGS. 10-16.

At step 2710, a dummy capping layer is formed in the memory region covering the memory cell structures. Then a logic device is formed within the logic region with the memory region protected by the dummy capping layer. See, for example, FIGS. 17-19.

At step 2712, with the dummy capping layer still in place covering the memory region, a sidewall spacer is formed alongside the logic device within the logic region.

As a result, the sidewall spacer is not formed in memory region. See, for example, FIG. 20.

At step 2714, the dummy capping layer is removed from the memory region. See, for example, FIG. 21.

At step 2716, source/drain regions are formed in memory region and logic regions. See, for example, FIG. 22.

At step 2718, a lower inter-layer dielectric layer is formed to fill spaces between the memory device structures in memory region and the logic devices within the logic region. An aspect ratio between memory devices is lowered for the inter-layer dielectric layer's filling in because of the absence of the sidewall spacer in memory region. See, for example, FIG. 23.

At step 2720, a replacement gate process is performed to replace the logic gate electrodes by metal gate electrodes for the logic devices within the logic region. See, for example, FIGS. 24-25.

At step 2722, an upper inter-layer dielectric layer is formed on the lower inter-layer dielectric layer overlying the memory device structures in memory region and the logic devices within the logic region. Contacts can be subsequently formed. See, for example, FIG. 26.

While the flowchart 2700 of FIG. 27 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application are directed towards an integrated circuit (IC). The IC comprises a memory region and a logic region integrated in a substrate. A memory cell structure is disposed on the memory region. The memory cell structure comprises a pair of control gate electrodes respectively disposed over the substrate and a pair of select gate electrodes disposed on opposite sides of the pair of control gate electrodes. A logic device is disposed on the logic region. The logic device comprises a logic gate electrode separated from the substrate by a logic gate dielectric. A sidewall spacer is disposed along a sidewall surface of the logic gate electrode. A contact etch stop layer (CESL) is disposed along a top surface of the substrate, extending upwardly along sidewall surfaces of the pair of select gate electrodes within the memory region, and extending upwardly along a sidewall surface of the sidewall spacer within the logic region. The contact etch stop layer (CESL) is in direct contact the sidewall surfaces of the pair of select gate electrodes and separated from the sidewall surface of the logic gate electrode by the sidewall spacer.

Further, some embodiments of the present application are directed towards a method comprising providing a substrate including a memory region and a logic region and forming and patterning a multilayer film to form a plurality of memory cell structures on the memory region. The method further comprises forming a dummy capping layer overlying the memory cell structures and forming a plurality of logic devices on the logic region, a logic device of the plurality of logic devices including a logic gate electrode separated from the substrate by a logic gate dielectric. The method further comprises forming the dummy capping layer covering the plurality of memory cell structures, forming a sidewall spacer along a sidewall surface of the logic gate electrode. The method further comprises removing the dummy capping layer from the memory region and filling a lower inter-layer dielectric layer between and over the plurality of memory cell structures.

Further, some embodiments of the present application are directed towards a method comprising providing a substrate including a memory region and a logic region and forming and patterning a multilayer film to form a plurality of memory cell structures on the memory region. The method further comprises forming and patterning a dummy capping layer protecting the memory cell structures and forming and patterning a logic gate dielectric layer and a polysilicon layer to form a plurality of logic devices on the logic region, a logic device of the plurality of logic devices comprises a logic gate electrode and a logic gate dielectric stacked on the logic region. The method further comprises forming the dummy capping layer covering the plurality of memory cell structures, forming a sidewall spacer along a sidewall surface of the logic gate electrode. The method further comprises removing the dummy capping layer from the memory region and forming source/drain regions on opposite sides of the pair of select gate electrodes within the memory region and on opposite sides of the logic gate electrode within the logic region. The method further comprises forming a contact etch stop layer (CESL) along an outline of the plurality of memory cell structures and the plurality of logic device and filling a lower inter-layer dielectric layer between and over the plurality of memory cell structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method for forming an integrated circuit (IC), the method comprising:
   providing a substrate including a memory region and a logic region;
   forming and patterning a multilayer film to form a plurality of memory cell structures on the memory region, wherein a memory cell structure of the plurality of memory cell structures is formed to have a pair of control gate electrodes respectively over the substrate and a pair of select gate electrodes disposed on opposite sides of the pair of control gate electrodes;
   forming a dummy capping layer overlying the memory cell structures;
   forming a plurality of logic devices on the logic region, a logic device of the plurality of logic devices including a logic gate electrode separated from the substrate by a logic gate dielectric;
   with the dummy capping layer covering the plurality of memory cell structures, forming a sidewall spacer along a sidewall surface of the logic gate electrode;
   removing the dummy capping layer from the memory region;
   forming a contact etch stop layer (CESL) along an outline of the plurality of memory cell structures and the logic device, wherein the CESL is in direct contact with the select gate electrodes within the memory region; and
   filling a lower inter-layer dielectric layer between and over the plurality of memory cell structures.

2. The method according to claim 1, wherein forming the plurality of memory cell structures comprises:
   forming a pair of floating gate electrodes respectively on a pair of channel regions of the substrate;
   forming a pair of control gate electrodes respectively on the floating gate electrodes; and
   forming the pair of select gate electrodes respectively on the pair of channel regions, and laterally alongside the control gate electrodes.

3. The method according to claim 2, wherein the select gate electrodes are formed by a conformal deposition process followed by a vertical etch process to leave vertical portions alongside the control gate electrodes and the floating gate electrodes.

4. The method according to claim 1, further comprises:
   wherein the CESL is in direct contact with the sidewall spacer within the logic region.

5. The method according to claim 1, further comprises:
   after removing the dummy capping layer from the memory region, forming source/drain regions on opposite sides of the pair of select gate electrodes within the memory region and on opposite sides of the logic gate electrode within the logic region.

6. The method according to claim 1, wherein forming the logic device comprises:
   forming a logic gate dielectric layer over the dummy capping layer on the memory region and directly on the substrate on the logic region;
   forming a polysilicon layer on the logic gate dielectric layer; and
   performing an etch into the logic gate dielectric layer and the polysilicon layer to form the logic gate electrode and the logic gate dielectric stacked on the logic region.

7. The method according to claim 4, wherein forming the logic device further comprises:
   performing an etching process to the lower inter-layer dielectric layer to expose the logic gate electrode; and
   replacing the logic gate electrode by a metal gate electrode.

8. The method according to claim 5, further comprising:
   forming an upper inter-layer dielectric layer over the lower inter-layer dielectric layer; and
   forming a contact through the upper inter-layer dielectric layer and the lower inter-layer dielectric layer reaching the source/drain regions within the memory region and the logic region.

9. The method according to claim 1, wherein forming the memory cell structure further comprises:
   forming a common source/drain region in the substrate between the pair of control gate electrodes; and
   forming an erase gate electrode on the common source/drain region.

10. A method for forming an integrated circuit (IC), the method comprising:
    providing a substrate including a memory region and a logic region;
    forming and patterning a multilayer film to form a plurality of memory cell structures on the memory region;
    forming and patterning a dummy capping layer protecting the memory cell structures;
    forming and patterning a logic gate dielectric layer and a polysilicon layer to form a plurality of logic devices on the logic region, a logic device of the plurality of logic devices comprises a logic gate electrode and a logic gate dielectric stacked on the logic region;
    with the dummy capping layer covering the plurality of memory cell structures, forming a sidewall spacer along a sidewall surface of the logic gate electrode;
    removing the dummy capping layer from the memory region;
    forming source/drain regions on opposite sides of a pair of select gate electrodes within the memory region and on opposite sides of the logic gate electrode within the logic region;
    forming a contact etch stop layer (CESL) along an outline of the plurality of memory cell structures and the plurality of logic device; and
    filling a lower inter-layer dielectric layer between and over the plurality of memory cell structures.

11. The method according to claim 10, further comprising:
    performing an etching process to the lower inter-layer dielectric layer to expose the logic gate electrode; and
    replacing the logic gate electrode by a metal gate electrode.

12. The method according to claim 11, further comprising:
    forming an upper inter-layer dielectric layer over the lower inter-layer dielectric layer; and
    forming a contact through the upper inter-layer dielectric layer and the lower inter-layer dielectric layer reaching the source/drain regions within the memory region and the logic region.

13. The method according to claim 10, wherein the CESL is in direct contact with the select gate electrodes within the memory region, and in direct contact with the sidewall spacer within the logic region.

14. A method for forming an integrated circuit (IC), the method comprising:
    forming a plurality of memory cell structures on a memory region of a substrate, wherein a memory cell structure of the plurality of memory cell structures is formed to have a pair of control gate electrodes respectively over the substrate and a pair of select gate electrodes disposed on opposite sides of the pair of control gate electrodes;

forming a plurality of logic devices on a logic region of the substrate, wherein a logic device of the plurality of logic devices is formed to have a logic gate electrode separated from the substrate by a logic gate dielectric;

forming a sidewall spacer along a sidewall surface of the logic gate electrode; and forming a contact etch stop layer (CESL) along a top surface of the substrate, extending upwardly along sidewall surfaces of the pair of select gate electrodes within the memory region, and extending upwardly along a sidewall surface of the sidewall spacer within the logic region;

wherein the contact etch stop layer (CESL) is in direct contact with the sidewall surfaces of the pair of select gate electrodes and separated from the sidewall surface of the logic gate electrode by the sidewall spacer.

15. The method according to claim 14, wherein the pair of control gate electrodes and the pair of select gate electrodes are made of polysilicon.

16. The method according to claim 14, wherein the logic gate electrode is made of polysilicon.

17. The method according to claim 14, further comprises:
forming an inter-layer dielectric layer on the contact etch stop layer (CESL) between and overlying the plurality of memory cell structures within the memory region and between the plurality of logic devices within the logic region.

18. The method according to claim 14, wherein the logic gate dielectric is made of a high κ dielectric layer, wherein the logic gate electrode is made of a metal material.

19. The method according to claim 14, wherein forming the memory cell structure comprises:
forming first and second individual source/drain regions in the substrate on opposite sides of the pair of select gate electrodes;
forming a common source/drain region disposed in the substrate between the pair of control gate electrodes, wherein the common source/drain region is separated from the first individual source/drain region and the second individual source/drain region; and
forming a pair of floating gate electrodes respectively separated from the pair of control gate electrodes by a control gate dielectric layer.

20. The method according to claim 19, further comprises:
forming a lower inter-layer dielectric layer on the contact etch stop layer (CESL) between the plurality of memory cell structures within the memory region and between the plurality of logic devices within the logic region, wherein the lower inter-layer dielectric layer has a planar top surface even with top surfaces of the pair of control gate electrodes and the logic gate electrode;
forming an upper inter-layer dielectric layer overlying the lower inter-layer dielectric layer; and
forming a contact through the upper inter-layer dielectric layer and the lower inter-layer dielectric layer reaching the first and second individual source/drain regions.

* * * * *